US012224609B2

(12) United States Patent
Fujihara et al.

(10) Patent No.: US 12,224,609 B2
(45) Date of Patent: Feb. 11, 2025

(54) POWER OUTPUT DEVICE, POWER INPUT DEVICE, AND POWER OUTPUT/INPUT DEVICE

(71) Applicant: HONDA MOTOR CO., LTD., Tokyo (JP)

(72) Inventors: Naoki Fujihara, Wako (JP); Noriyuki Ishida, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 562 days.

(21) Appl. No.: 17/611,919

(22) PCT Filed: May 21, 2020

(86) PCT No.: PCT/JP2020/020037
§ 371 (c)(1),
(2) Date: Nov. 17, 2021

(87) PCT Pub. No.: WO2020/235617
PCT Pub. Date: Nov. 26, 2020

(65) Prior Publication Data
US 2022/0255332 A1 Aug. 11, 2022

(30) Foreign Application Priority Data
May 21, 2019 (JP) .................................. 2019-095585

(51) Int. Cl.
*H02J 7/00* (2006.01)
*H02B 1/46* (2006.01)
(Continued)

(52) U.S. Cl.
CPC .............. *H02J 7/0045* (2013.01); *H02B 1/46* (2013.01); *H02J 7/00032* (2020.01);
(Continued)

(58) Field of Classification Search
CPC ........ H02J 7/0013; H02J 7/342; H02J 7/0047; H02J 7/00; H02J 2207/40; H02J 7/00047;
(Continued)

(56) References Cited

U.S. PATENT DOCUMENTS

| | | | |
|---|---|---|---|
| 11,824,383 B2 * | 11/2023 | Miller | ...................... H02J 7/007 |
| 2007/0273326 A1 * | 11/2007 | Krieger | .................. H02J 7/0042 |
| | | | 320/110 |

(Continued)

FOREIGN PATENT DOCUMENTS

| | | |
|---|---|---|
| CN | 103368222 | 10/2013 |
| JP | 3085707 | 5/2002 |

(Continued)

OTHER PUBLICATIONS

Extended European Search Report for European Patent Application No. 20808930.0 dated Jun. 24, 2022.
(Continued)

*Primary Examiner* — Michael A Matey
(74) *Attorney, Agent, or Firm* — Amin, Turocy & Watson

(57) ABSTRACT

A better power output device is provided. A charging and power supply device having a power source in a housing, wherein the housing has USB power output terminals to which a load that receives DC output power is connected, AC power output terminals to which a load that receives AC output power is connected, a USB switch that receives an instruction from a user to output power from the USB power output terminals, and an AC switch that receives an instruction from the user to output power from the AC power output terminals, and the USB switch and the AC switch are disposed so as to match the arrangement order of the USB electric power output terminals and the AC electric power output terminals in the arrangement direction of the USB power output terminals and the AC power output terminals.

23 Claims, 28 Drawing Sheets

(51) Int. Cl.
*G06F 1/26* (2006.01)
*H05K 5/00* (2006.01)

(52) U.S. Cl.
CPC .............. *H02J 7/0013* (2013.01); *G06F 1/26* (2013.01); *H05K 5/0086* (2013.01)

(58) Field of Classification Search
CPC ...... H02J 7/0044; H02J 1/122; H02J 2207/20; H02J 2207/30; H02J 2310/22; H02J 7/00036; H02J 7/02; H02J 7/0049; H01M 10/46; H01M 10/488; H01M 10/482; H01M 2220/10; H01M 50/204; H01M 50/251; H01M 10/4257; H01M 10/4221; H05K 5/0086; B60L 53/16; G06F 1/26; G06F 1/263; G06F 1/3212; H02B 1/26; H02H 7/122; Y02T 10/70
See application file for complete search history.

(56) References Cited

U.S. PATENT DOCUMENTS

| | | | | |
|---|---|---|---|---|
| 2007/0285049 | A1* | 12/2007 | Krieger | H02J 7/00 320/105 |
| 2012/0025766 | A1* | 2/2012 | Reade | G06F 11/327 320/110 |
| 2013/0257346 | A1* | 10/2013 | Jakins | H02J 7/35 320/107 |
| 2014/0098525 | A1* | 4/2014 | Bennett | H02J 7/0045 320/135 |
| 2015/0091392 | A1* | 4/2015 | Hwang | H02J 7/0045 307/150 |
| 2017/0012448 | A1* | 1/2017 | Miller | H02J 7/0029 |
| 2017/0117726 | A1* | 4/2017 | Jore | H02J 7/342 |
| 2018/0238954 | A1* | 8/2018 | Robison | H02J 7/0045 |
| 2019/0075665 | A1* | 3/2019 | Choksi | H05K 7/20209 |
| 2020/0099227 | A1* | 3/2020 | Vasefi | H01M 10/46 |
| 2020/0343748 | A1* | 10/2020 | Ho | H02J 7/00 |
| 2020/0403425 | A1* | 12/2020 | Fry | H02J 7/0025 |

FOREIGN PATENT DOCUMENTS

| | | |
|---|---|---|
| JP | 2018-195492 | 12/2018 |
| JP | 2019-068552 | 4/2019 |
| KR | 20180022092 | 3/2018 |
| WO | 2019065276 | 4/2019 |

OTHER PUBLICATIONS

International Search Report and Written Opinion for International Application No. PCT/JP2020/020037 mailed on Aug. 11, 2020, 9 pages.

Chinese Office Action and Search Report for Chinese Patent Application No. 202080037246.X dated Sep. 21, 2024.

* cited by examiner

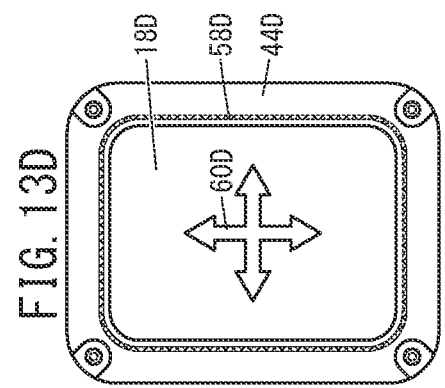
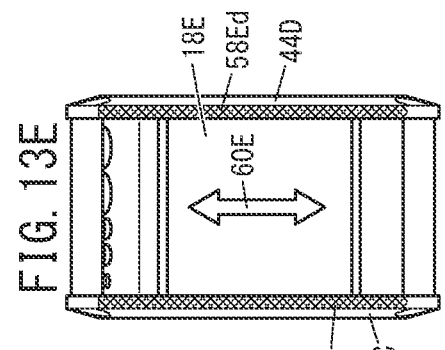
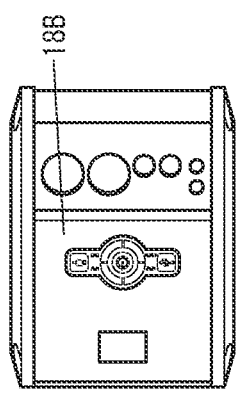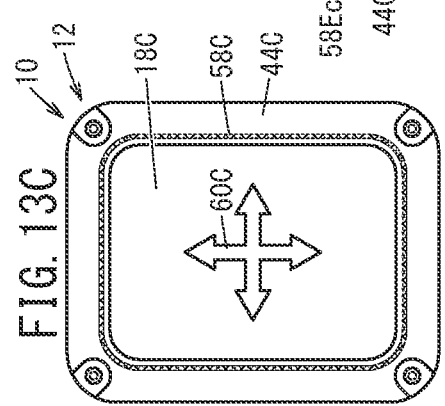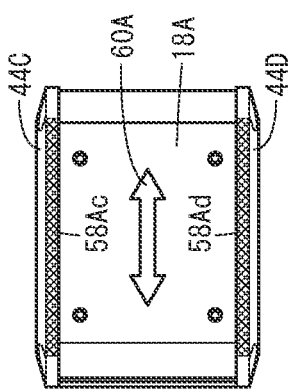
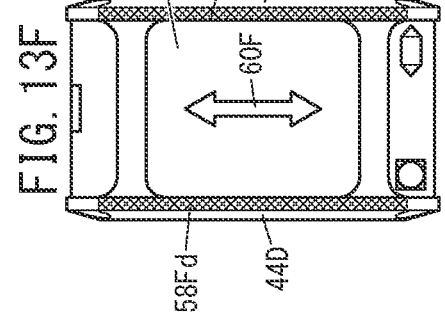

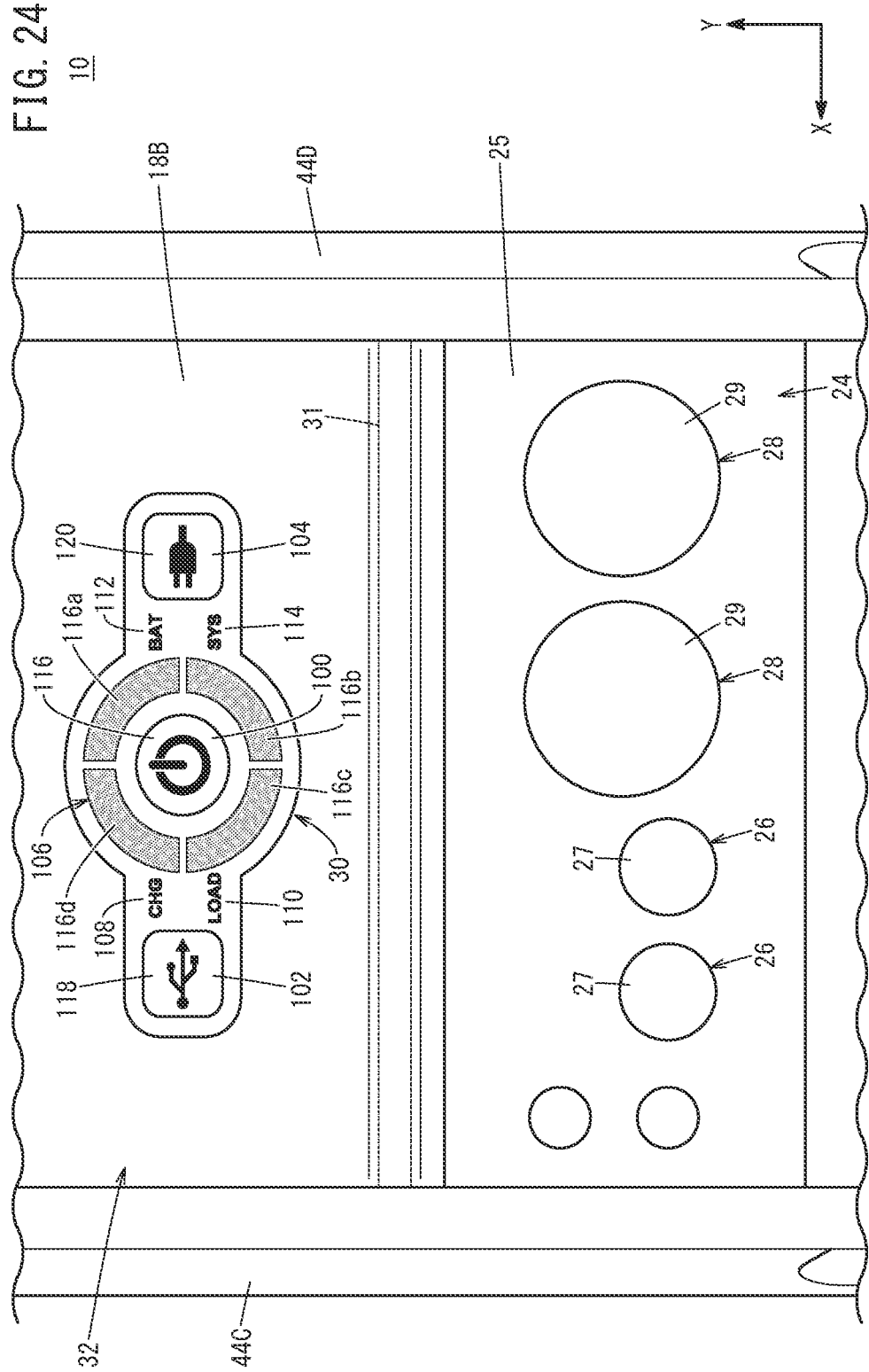

FIG. 25

| LIGHT | LIGHT EMISSION COLOR | LIGHTING PATTERN | | |
|---|---|---|---|---|
| | | MEANING | TURNED ON | BLINKING | TURNED OFF |
| MAIN SWITCH LIGHT 100 | WHITE | ON | ON | STATE-TRANSITIONING | OFF |
| USB SWITCH LIGHT 102 | BLUE | DISCHARGE | POWER ON | PREPARING FOR OPERATION OR PREPARING FOR STOP | POWER OFF |
| AC SWITCH LIGHT 104 | | | DISCHARGING | | NOT DISCHARGING |
| USB SWITCH LIGHT 102 | GREEN | CHARGE | CHARGING | COUNTING DOWN TO OVERLOAD STOP (REMAINING AMOUNT INDICATION LIGHT) | NOT CHARGING |
| AC SWITCH LIGHT 104 | | | | STANDBY STATE FOR STARTING CHARGING | |
| REMAINING AMOUNT INDICATION LIGHT 106 | YELLOW | UNABLE TO CONTINUE FUNCTIONING | OVERLOAD STATE (OVERLOAD LIGHT) | COUNTING DOWN TO OVERLOAD STOP (REMAINING AMOUNT INDICATION LIGHT) | NOT OVERLOAD (OVERLOAD LIGHT) |
| REMAINING AMOUNT INDICATION LIGHT 106 | RED | FUNCTION DISABLED | ERROR STATE (CHARGE PROTECTION LIGHT) (BATTERY ERROR LIGHT) (SYSTEM ERROR LIGHT) | COUNTING DOWN TO ERROR STOP (REMAINING AMOUNT INDICATION LIGHT) | NO ERROR (CHARGE PROTECTION LIGHT) (BATTERY ERROR LIGHT) (SYSTEM ERROR LIGHT) |
| OVERLOAD LIGHT 110 | | | | | |
| CHARGE PROTECTION LIGHT 108 | | | | | |
| BATTERY ERROR LIGHT 112 | | | | | |
| SYSTEM ERROR LIGHT 114 | | | | | |

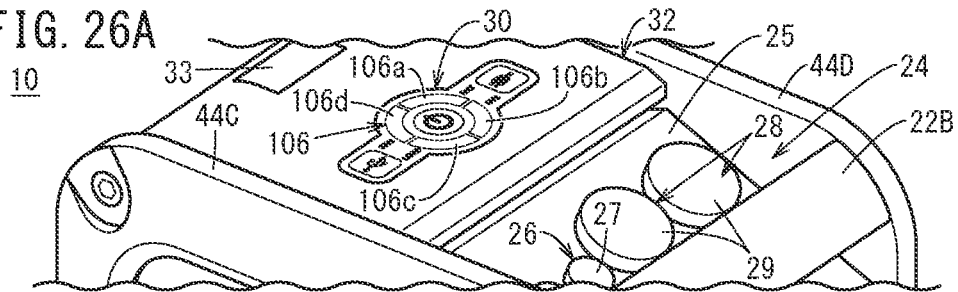
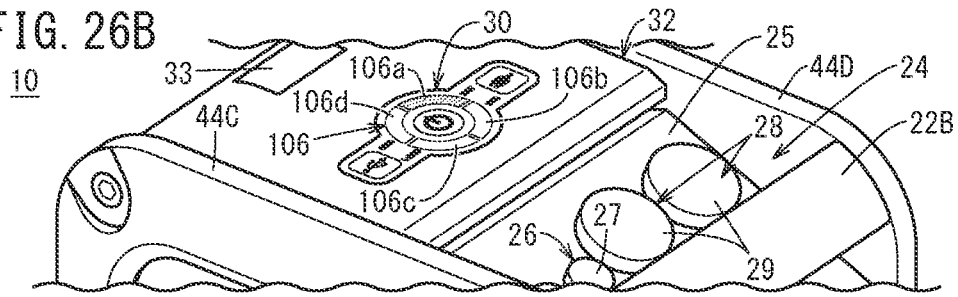
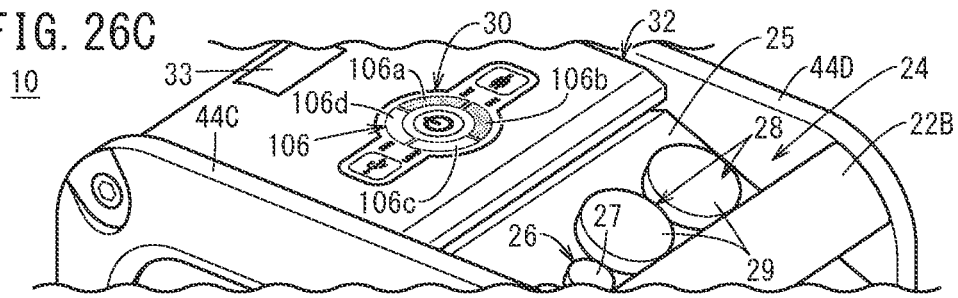
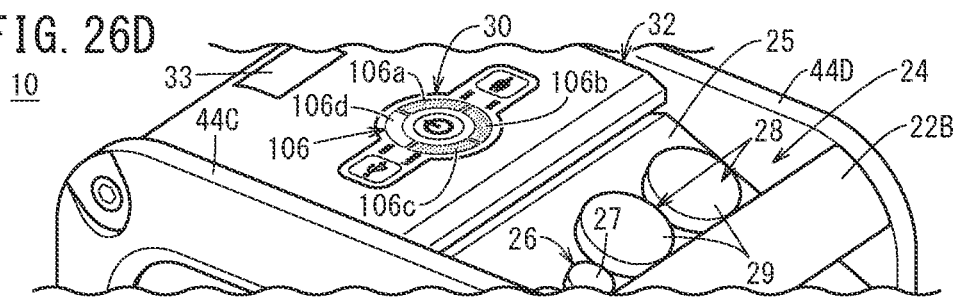
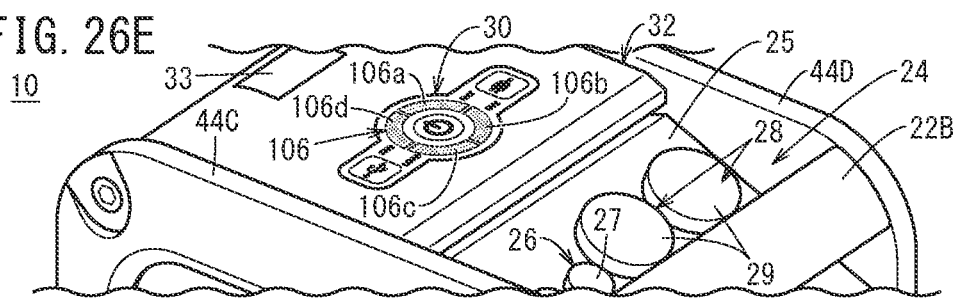

POWER OUTPUT DEVICE, POWER INPUT DEVICE, AND POWER OUTPUT/INPUT DEVICE

TECHNICAL FIELD

The present invention relates to a power output device, a power input device, and a power output/input device. The power output device includes an internal power supply source in a casing, the internal power supply source configured to output electric power to outside. The power input device includes in a casing, an internal load to which electric power is input from outside. The power output/input device includes in a casing, at least one of an internal power supply or an internal load, the internal power supply configured to output electric power to outside, electric power being input from outside to the internal load.

BACKGROUND ART

JP 2019-068552 A discloses a portable charging power supply device provided with a USB terminal to which a USB cable can be connected and an outlet to which a commercial power supply plug can be connected.

SUMMARY OF INVENTION

However, there is demand for providing a better power output device, a better power input device, and a better power output/input device.

An object of the present invention is to provide a better power output device, a better power input device, and a better power output/input device.

A power output device according to one aspect of the present invention includes an internal power supply in a casing, the internal power supply configured to output electric power to outside, and the power output device includes a first terminal to which a load is to be connected, the load receiving an output power of a first type from the power output device, a second terminal to which a load is to be connected, the load receiving an output power of a second type that is different from the first type, from the power output device, a first device configured to receive from a user an output instruction of power from the first terminal, and a second device configured to receive from a user an output instruction of power from the second terminal, wherein the first terminal and the second terminal are arranged in a direction that is identical to a direction in which the first device and the second device are arranged, in a manner that order of arrangement of the first terminal and the second terminal is identical to order of arrangement of the first device and the second device.

A power input device according to one aspect of the present invention includes in a casing, an internal load to which electric power is input from outside, and the power input device includes a third terminal configured to receive an input power of a first type from outside, a fourth terminal configured to receive an input power of a second type from outside, the second type being different from the first type, a first device configured to receive from a user an input instruction of power from the third terminal, and a second device configured to receive from a user an input instruction of power from the fourth terminal, wherein the third terminal and the fourth terminal are arranged in a direction that is identical to a direction in which the first device and the second device are arranged, in a manner that order of arrangement of the third terminal and the fourth terminal is identical to order of arrangement of the first device and the second device.

A power output/input device according to one aspect of the present invention includes in a casing, at least one of an internal power supply or an internal load, the internal power supply configured to output electric power to outside, electric power being input from outside to the internal load, and the power output/input device includes at least one of a terminal set including a first terminal and a second terminal or another terminal set including a third terminal and a fourth terminal, wherein a load is to be connected to the first terminal, the load receives an output power of a first type from the power output/input device, a load is to be connected to the second terminal, the load receives an output power of a second type that is different from the first type, from the power output/input device, the third terminal is configured to receive an input power of the first type from outside, and the fourth terminal is configured to receive an input power of the second type from outside, a first device configured to receive from a user an output instruction of power from the first terminal or an input instruction of power from the third terminal, a second device configured to receive from a user an output instruction of power from the second terminal or an input instruction of power from the fourth terminal, an opening configured to provide communication between inside and outside of the casing, and a cover portion provided to the casing pivotably on a pivoting shaft to cover the opening, wherein the first device and the second device are arranged at the cover portion.

According to the present invention, it is possible to provide a better power output device, a better power input device, and a better power output/input device.

BRIEF DESCRIPTION OF DRAWINGS

FIGS. 13A, 13B, 13C, 13D, 13E and 13F show six orthogonal views of the charging power supply device according to an embodiment;

FIG. 24 is a perspective view of the charging power supply device according to an embodiment;

FIG. 25 is a table showing states of the charging power supply device based on a combination of light emission colors and lighting patterns of the indicator;

FIGS. 26A, 26B, 26C, 26D and 26E show display examples of the remaining amount indication light based on an SOC of the battery;

DESCRIPTION OF THE INVENTION

Preferred embodiments of a charging power supply device according to the present invention will be presented and described below with reference to the accompanying drawings.

Embodiment

Figure 1:
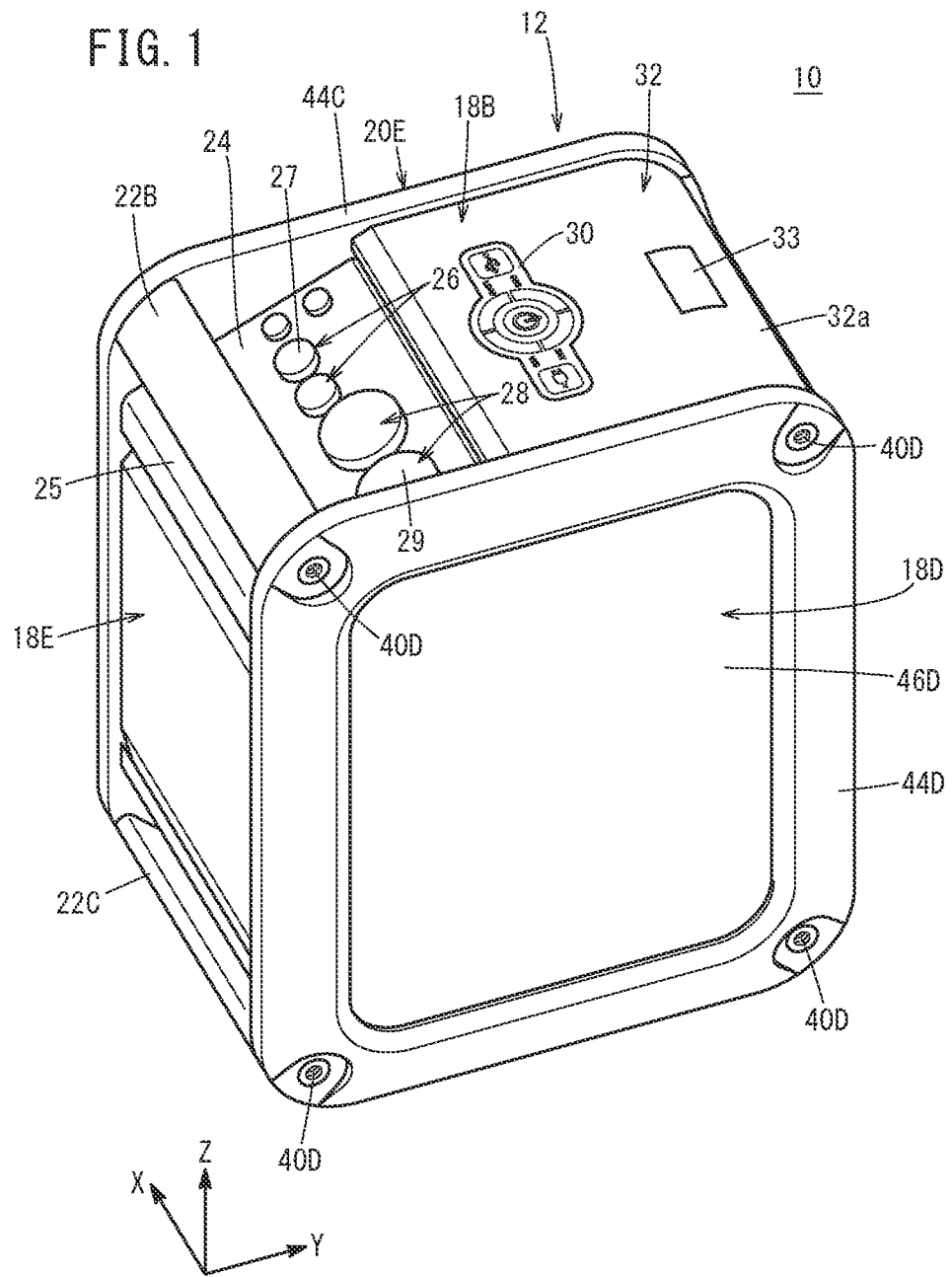
FIG. 1 is a perspective view of a charging power supply device according to an embodiment.

A charging power supply device according to one embodiment will be described using drawings. FIG. 1 is a perspective view of the charging power supply device according to an embodiment.

As shown in FIG. 1, a charging power supply device 10 includes a casing 12. The shape of the casing 12 is substantially polyhedral. More specifically, the shape of the casing 12 is substantially a rectangular parallelepiped. As shown in FIG. 1, each vertex and each edge of the casing 12 are filleted. That is, each vertex and each edge of the casing 12 is made to have a rounded shape. The charging power supply device 10 corresponds to the power output device, the power input device, and the power output/input device according to the present invention.

Figure 2:
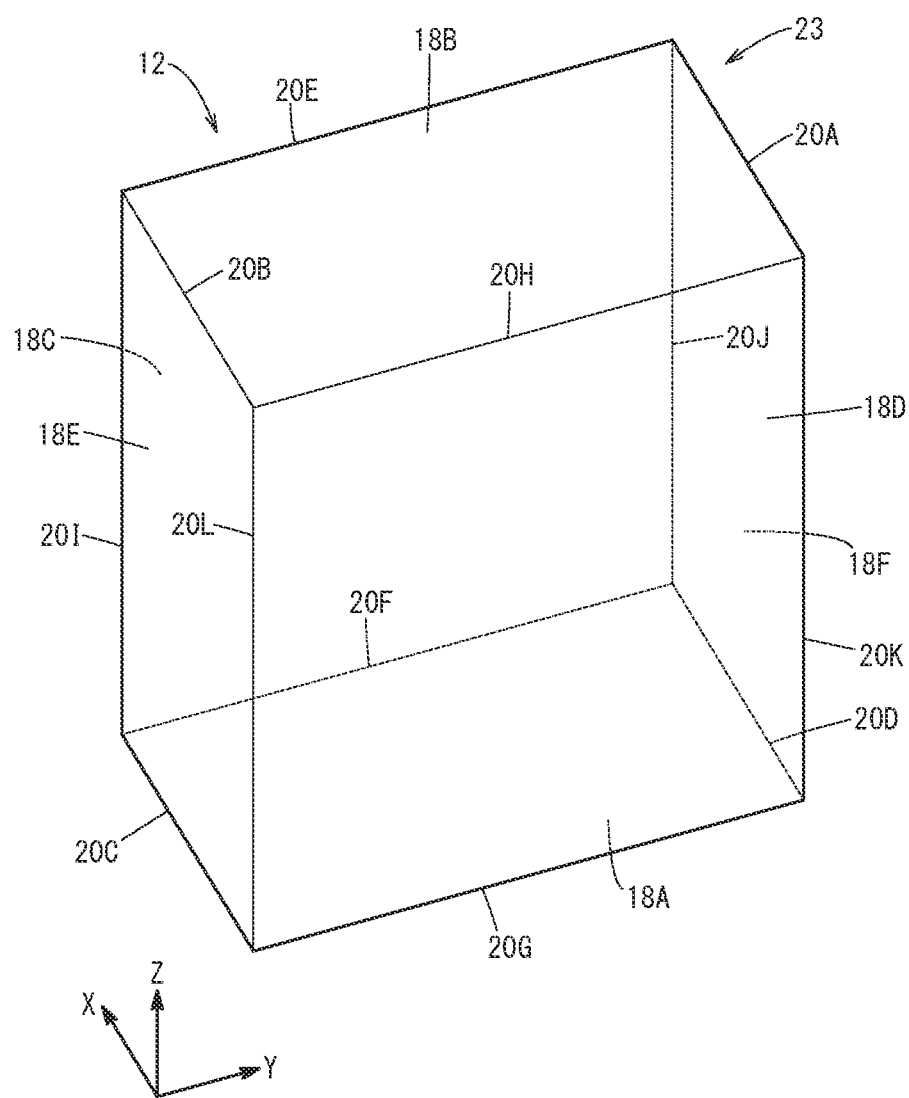
FIG. 2 shows a model of a rectangular parallelepiped corresponding to a casing of the charging power supply device according to an embodiment.

FIG. 2 shows a model of a rectangular parallelepiped corresponding to a casing of the charging power supply device according to the present embodiment. As shown in FIG. 2, a rectangular parallelepiped 23 corresponding to the casing 12 includes a bottom surface (floor surface) 18A, a top surface 18B, a left-side surface (side surface) 18C, a right-side surface (side surface) 18D, a front surface (front-side surface, side surface) 18E, and a rear surface (rear-side surface, side surface) 18F. The reference numeral 18 is used when describing a surface in general, and the reference numerals 18A to 18F are used when describing each individual surface.

The left-side surface 18C, the right-side surface 18D, the front surface 18E, and the rear surface 18F are bent from and continuous with the bottom surface 18A. Furthermore, the left-side surface 18C, the right-side surface 18D, the front surface 18E, and the rear surface 18F are bent from and continuous with the top surface 18B. The bottom surface 18A and the top surface 18B are aligned with each other. That is, the bottom surface 18A and the top surface 18B are parallel to each other. In other words, the normal direction of the bottom surface 18A and the normal direction of the top surface 18B are aligned with each other. The left-side surface 18C and the right-side surface 18D are aligned with each other. In other words, the normal direction of the left-side surface 18C and the normal direction of the right-side surface 18D are aligned with each other. The front surface 18E and the rear surface 18F are aligned with each other. In other words, the normal direction of the front surface 18E and the normal direction of the rear surface 18F are aligned with each other.

The direction from the left-side surface 18C toward the right-side surface 18D or the direction from the right-side surface 18D to the left-side surface 18C is a width direction (X direction). The direction from the front surface 18E toward the rear surface 18F or the direction from the rear surface 18F toward the front surface 18E is a depth direction (Y direction). The direction from the bottom surface 18A toward the top surface 18B or the direction from the top surface 18B toward the bottom surface 18A is a height direction (Z direction).

The rectangular parallelepiped 23 corresponding to the casing 12 has twelve edges 20A to 20L. The edge 20A is positioned at the region (portion, location) where the top surface 18B and the rear surface 18F intersect. The edge 20B is positioned at the region where the top surface 18B and the front surface 18E intersect. The edge 20C is positioned at the region where the bottom surface 18A and the front surface 18E intersect. The edge 20D is positioned at the region where the bottom surface 18A and the rear surface 18F intersect. The edges 20A to 20D are aligned with each other.

The edge 20E is positioned at the region where the top surface 18B and the left-side surface 18C intersect. The edge 20F is positioned at the region where the bottom surface 18A and the left-side surface 18C intersect. The edge 20G is positioned at the region where the bottom surface 18A and the right-side surface 18D intersect. The edge 20H is positioned at the region where the right-side surface 18D and the top surface 18B intersect. The edges 20E to 20H are aligned with each other.

The edge 20I is positioned at the region where the front surface 18E and the left-side surface 18C intersect. The edge 20J is positioned at the region where the left-side surface 18C and the rear surface 18F intersect. The edge 20K is positioned at the region where the rear surface 18F and the right-side surface 18D intersect. The edge 20L is positioned at the region where the front surface 18E and the right-side surface 18D intersect. The edges 20I to 20L are aligned with each other.

Figure 3:
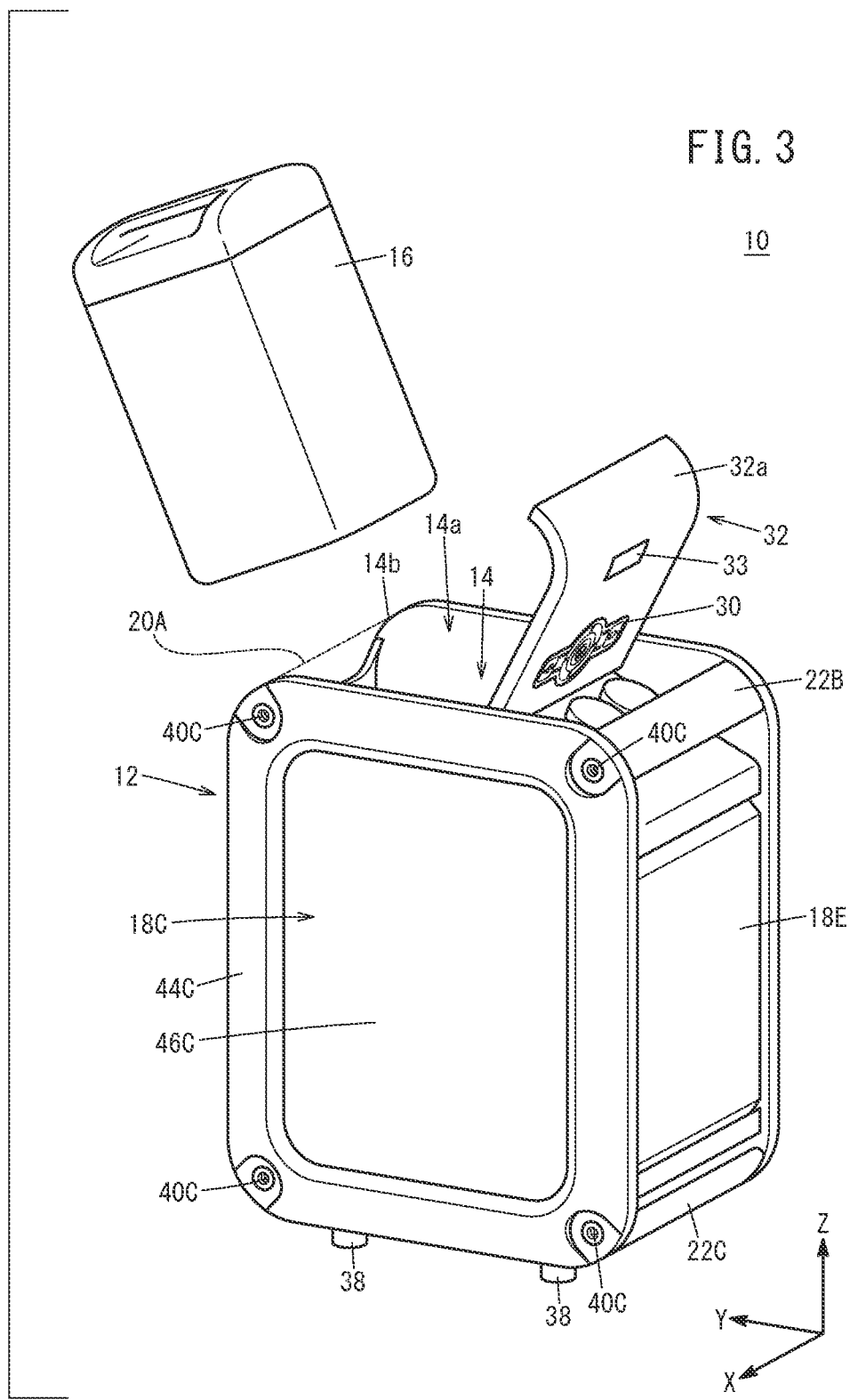
FIG. 3 is a perspective view of the charging power supply device according to an embodiment.

FIG. 3 is a perspective view of the charging power supply device according to the present embodiment. As shown in FIG. 3, the casing 12 includes a containment chamber 14 (containment portion). A battery (contained item) 16 can be contained inside the containment chamber 14. The battery 16 can be inserted into and removed from the containment chamber 14. The battery 16 corresponds to an internal power supply or an internal load of the present invention.

As shown in FIGS. 1 and 3, a cover portion (covering member, cover) 32 that covers an opening 14a continuous with the containment chamber 14 is included on the top portion of the casing 12. The cover portion 32 includes an open button 33. When the open button 33 is pressed by a user, the cover portion 32 opens. The open button 33 corresponds to a release portion of the present invention. FIG. 1 shows a state in which the cover portion 32 is closed. FIG. 3 shows a state in which the cover portion 32 is open. As shown in FIG. 1, the cover portion 32 includes an indicator 30 that indicates the remaining amount of the battery 16. The cover portion 32 is capable of pivoting on a pivoting shaft 31 (see FIG. 8) provided to the top surface 18B. This pivoting shaft 31 is provided on the side of a recessed portion 24 described further below. By having the cover portion 32 pivot on the pivoting shaft 31, the containment chamber 14 can be opened and closed. As shown in FIG. 3, when the cover portion 32 is open, the user can insert and remove the battery 16 into and from the containment chamber 14. As shown in FIG. 1, when the cover portion 32 is closed, one end of the cover portion 32 is near the top end of the rear surface 18F. In other words, when the cover portion 32 is closed, the one end of the cover portion 32 is positioned near the location corresponding to the edge 20A. The cover portion 32 includes a curved portion 32a. When the cover portion 32 is closed, the curved portion 32a is positioned at a location corresponding to the edge 20A.

As shown in FIG. 2, the edge 20A is positioned at one side of the rear surface 18F, namely the top side. In other words, the edge 20A is positioned at one side of the top surface 18B, namely the rear side. As shown in FIGS. 2 and 3, the opening 14a continuous with the containment chamber 14, or a peripheral edge portion 14b of the opening 14a continuous with the containment chamber 14, is positioned at the location corresponding to the edge 20A.

As shown in FIG. 2, the edge 20B is positioned at one side of the front surface 18E, namely the top side. In other words, the edge 20B is positioned at the other side of the top surface 18B, namely the front side. As described above, the edge 20B is aligned with the edge 20A. As shown in FIG. 1, a handle portion (first handle portion, gripping portion, bar, support portion, or grip) 22B is included at the region corresponding to the edge 20B. The handle portion 22B extends in the width direction, i.e., the X direction.

As shown in FIG. 2, the edge 20C is positioned at the other side of the front surface 18E, namely the bottom side. In other words, the edge 20C is positioned at the one side of the bottom surface 18A, namely the front side. As described above, the edge 20C is aligned with the edge 20A. As shown in FIG. 1, a handle portion (second handle portion, gripping portion, bar, support portion, or grip) 22C is included at the region corresponding to the edge 20C. The handle portion 22C extends in the width direction, i.e., the X direction.

Figure 4:
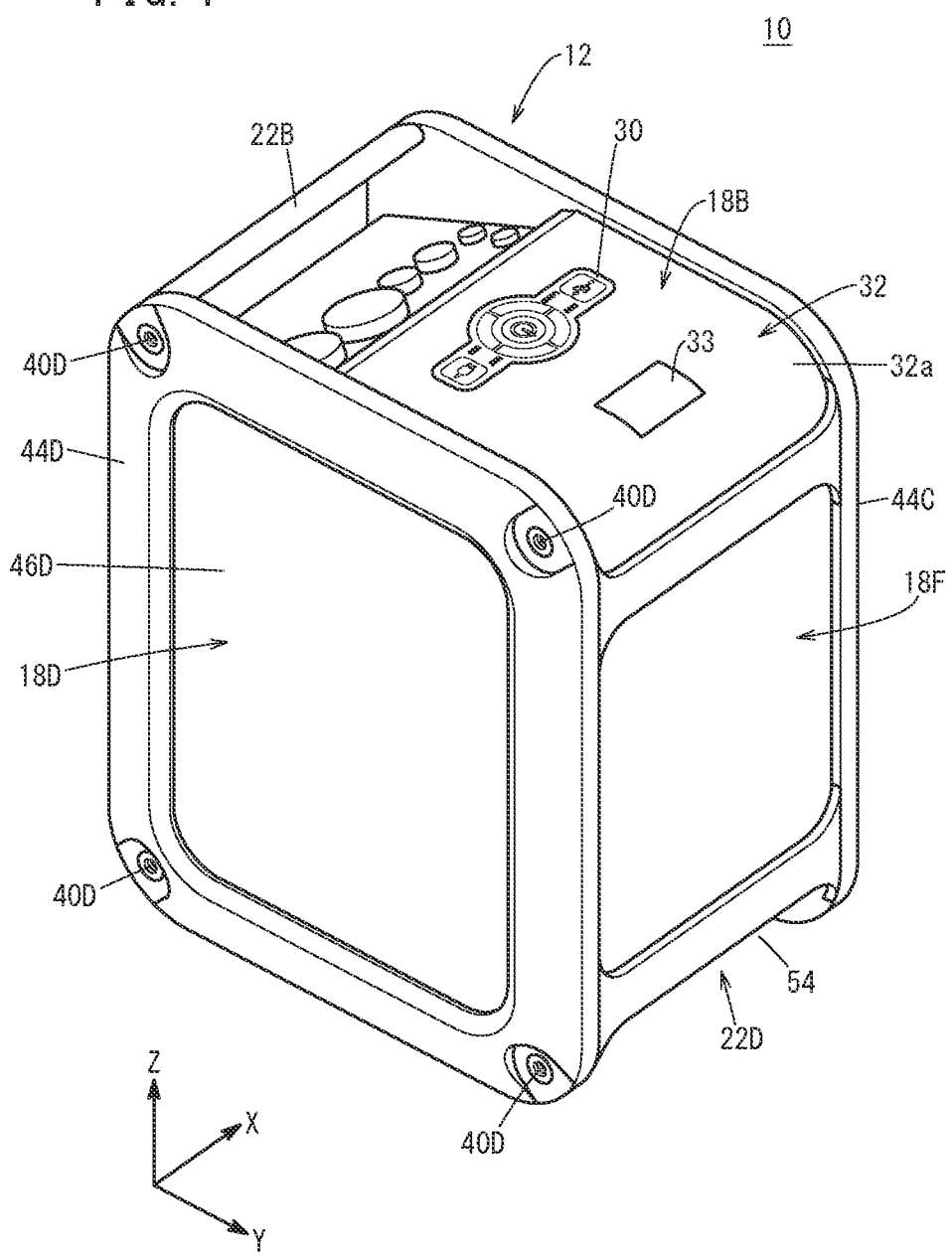
FIG. 4 is a perspective view of the charging power supply device according to an embodiment.
Figure 7:
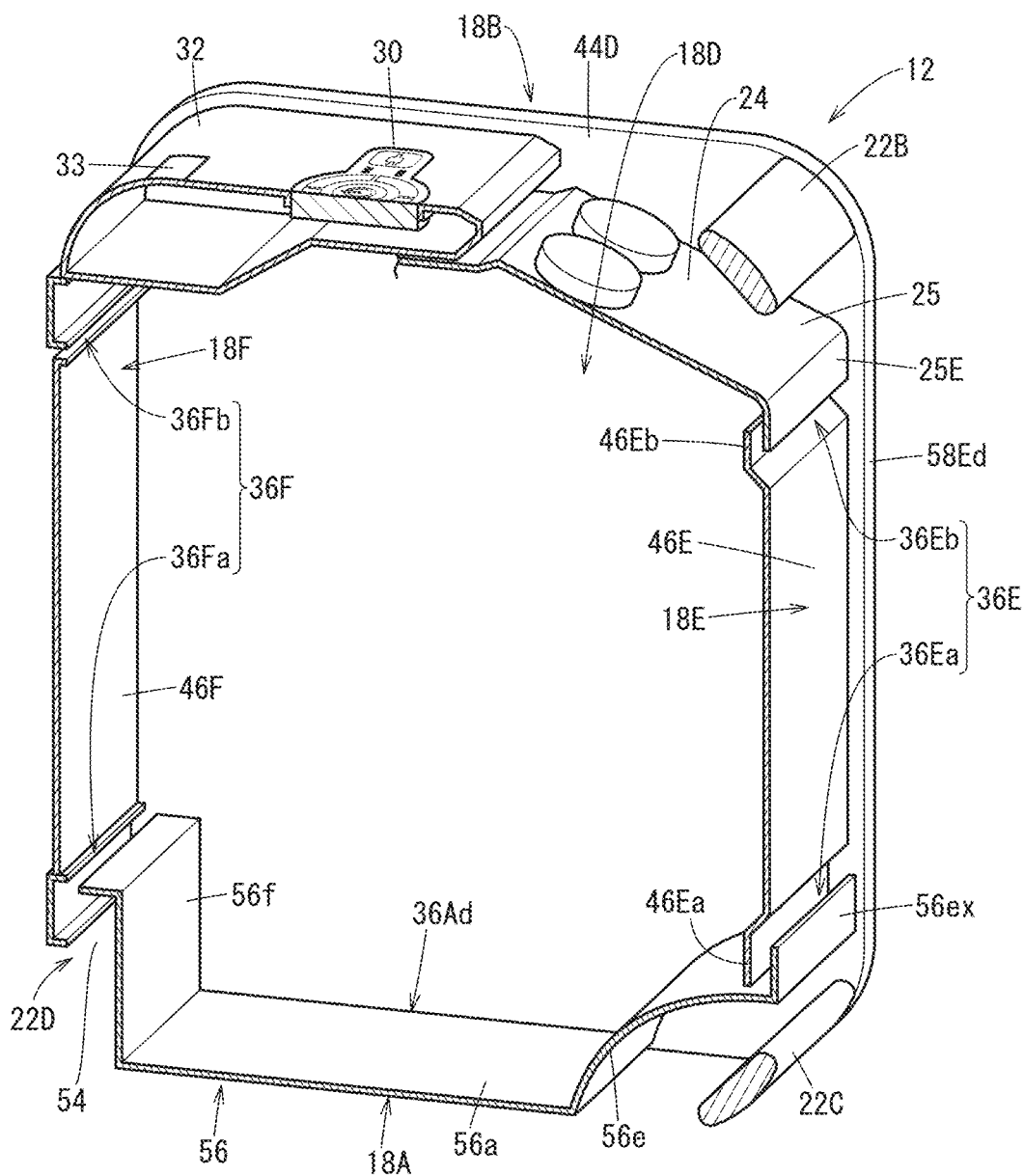
FIG. 7 is a cross-sectional perspective view of the charging power supply device according to an embodiment.

The edge 20D is positioned at the other side of the rear surface 18F, namely the bottom side. In other words, the edge 20D is positioned at the other side of the bottom surface 18A, namely the rear side. As described above, the edge 20D is aligned with the edge 20A. FIG. 4 is a perspective view of the charging power supply device according to the present embodiment. As shown in FIG. 4, a handle portion (third handle portion, support portion, holding portion, or recessed portion) 22D is included at the region corresponding to the edge 20D. The handle portion 22D extends in the width direction, i.e., the X direction, and is depressed toward the front surface 18E side. In other words, the handle portion 22D is formed by forming a recessed space 54 (see FIG. 4) that is recessed toward the top surface 18B side in the casing 12. The recessed space 54 is defined by a portion 56f (see FIG. 7) described further below. As shown in FIG. 7, the top part of this portion 56f is bent toward the rear surface 18F side. The part of this portion 56f that is bent toward the rear surface 18F side is positioned on the top surface 18B side of the bottom end region of the handle portion 22D. The reference numeral 22 is used when describing a handle portion in general, and the reference numerals 22B to 22D are used when describing each individual handle portion.

As shown in FIG. 1, the recessed portion 24, which has a shape formed by cutting away a part of the top surface 18B and the front surface 18E, is formed near the region corresponding to the edge 20B. The floor portion of the recessed portion 24 is defined by a member 25, one side portion of the recessed portion 24 is formed by part of an outer marginal member 44C described further below, and the other side portion of the recessed portion 24 is formed by part of an outer marginal member 44D described further below. The surface of the member 25 forming the floor portion of the recessed portion 24 is inclined relative to the top surface 18B. Since the recessed portion 24 is formed in this way, the handle portion 22B can be included at the location corresponding to the edge 20B. The member 25 forming the floor portion of the recessed portion 24 includes a USB power output terminal (output terminal or connector) 26 and an AC power output terminal (output terminal or connector) 28. The USB power output terminal 26 and the AC power output terminal 28 are for supplying power from the charging power supply device 10 to an external device. The USB power output terminal 26 can output DC power. The USB power output terminal 26 is, for example, a USB terminal to which a USB cable can be connected. That is, The USB power output terminal 26 is an outlet to which a USB cable can be connected. A load that receives DC power can be connected to the USB power output terminal 26. The AC power output terminal 28 can output AC power. The AC power output terminal 28 is an outlet to which a commercial power supply plug can be connected, for example. A load that receives AC power can be connected to the AC power output terminal 28. Here, an example is described of a case where two USB power output terminals 26 and two AC power output terminals 28 are included, but the number of USB power output terminals 26 and the number of AC power output terminals 28 are not limited to this. FIG. 1 shows a state in which caps 27 and 29 respectively cover the USB power output terminal 26 and the AC power output terminal 28. The caps 27 and 29 are for protecting the USB power output terminal 26 and the AC power output terminal 28, respectively. The USB power output terminal 26 corresponds to a first terminal of the present invention, and the AC power output terminal 28 corresponds to a second terminal of the present invention. The DC power corresponds to a first type of output power of the present invention, and the AC power corresponds to a second type of output power of the present invention.

Figure 5:
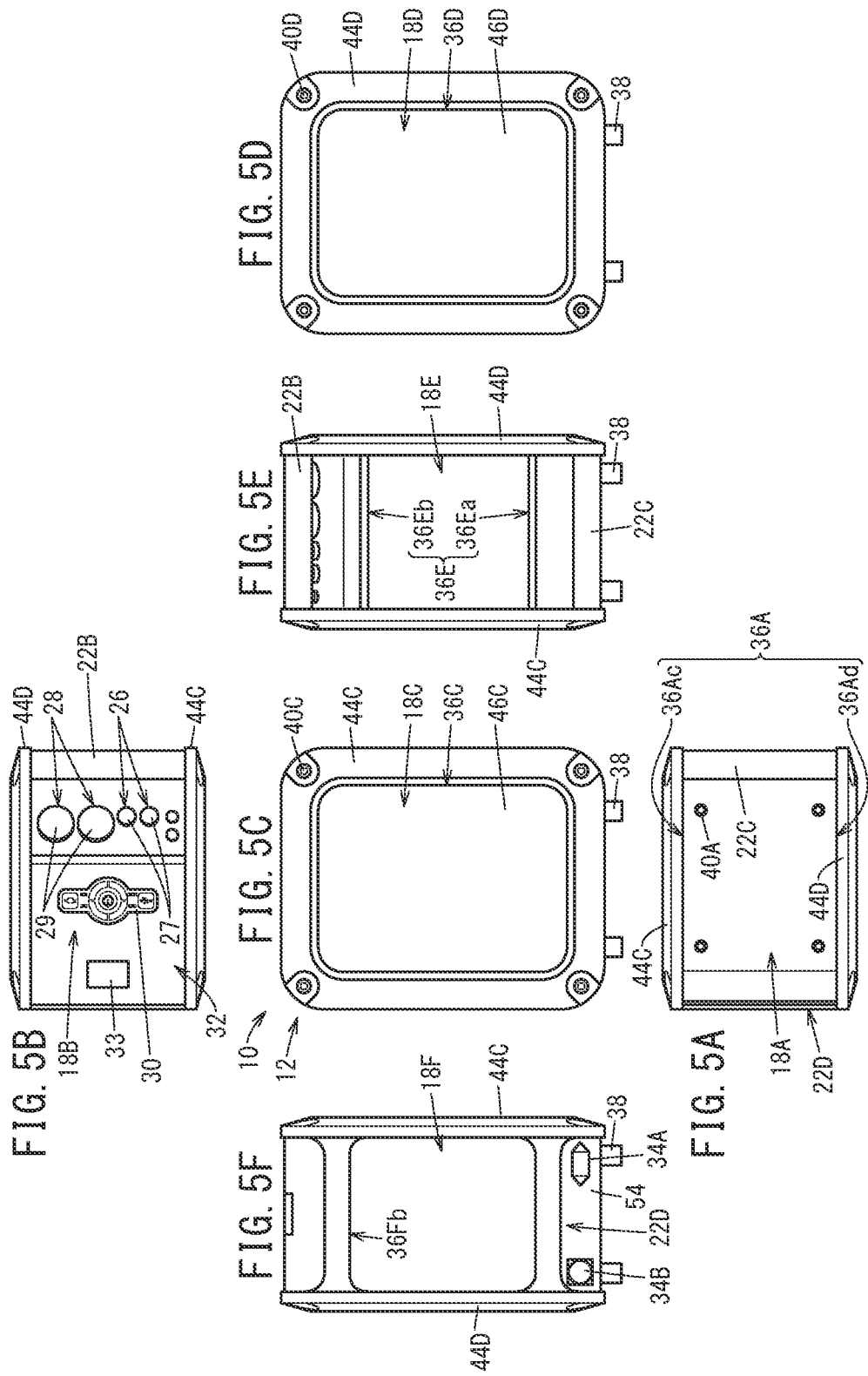
FIGS. 5A, 5B, 5C, 5D, 5E and 5F are six orthogonal views of the charging power supply device according to an embodiment.

FIGS. 5A to 5F are six orthogonal views of the charging power supply device according to the present embodiment. FIG. 5A is a bottom view, FIG. 5B is a top view, FIG. 5C is a left side view, FIG. 5D is a right side view, FIG. 5E is a front view, and FIG. 5F is a rear view. FIGS. 5C, 5D, 5E, and 5F show grounding protrusions 38 that are described further below, but these grounding protrusions 38 are omitted from FIG. 5A.

As shown in FIG. 5F, an AC power input terminal (input terminal or connector) 34A and a DC power input terminal (input terminal or connector) 34B are included in the recessed space 54. The AC power input terminal 34A and the DC power input terminal 34B are for receiving power from outside to the charging power supply device 10. The AC power input terminal 34A is a socket to which a power supply cable (not shown in the drawings) can be connected. The power supply cable is connected to the AC power input terminal 34A for inputting power supplied from a commercial AC power supply to the charging power supply device 10. The DC power input terminal 34B is a socket to which a power supply cable (not shown in the drawings) can be connected. The power supply cable is connected to the DC power input terminal 34B for inputting DC power to the charging power supply device 10.

Figure 6:
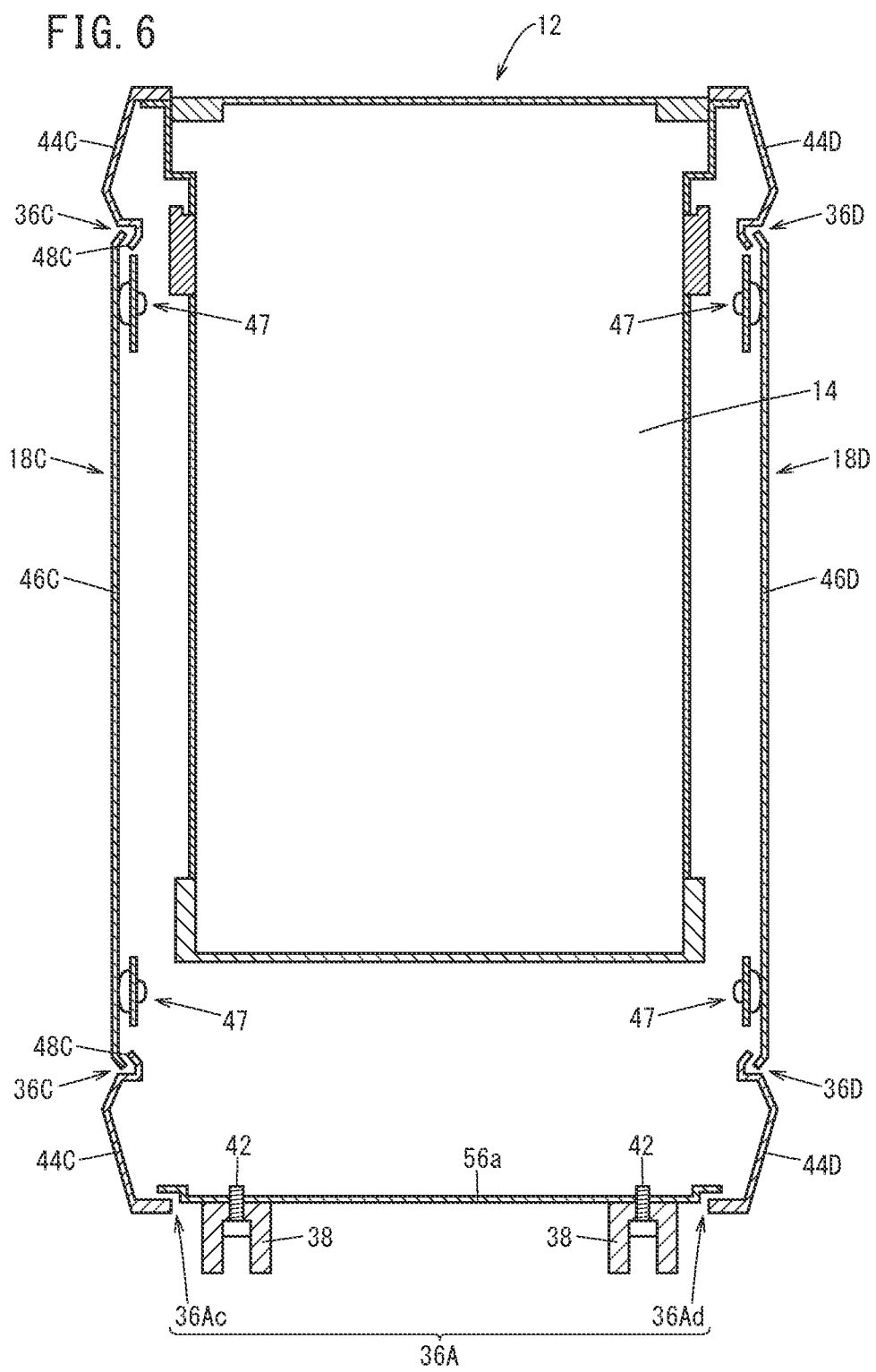
FIG. 6 is a cross-sectional view of the charging power supply device according to an embodiment.

As shown in FIG. 5A, screw holes 40A for attaching the grounding protrusions 38 (see FIG. 3) are included in the bottom surface 18A of the casing 12. FIG. 6 is a cross-sectional view of the charging power supply device according to the present embodiment. As shown in FIG. 6, the grounding protrusions 38 can be attached to the bottom surface 18A of the casing 12 by using screws 42. When the casing 12 is set to the upright position in a state where the grounding protrusions 38 are attached to the bottom surface 18A, the grounding protrusions 38 enter a state of protruding toward the floor (floor surface, loading surface, or installation surface). As shown in FIG. 5C, screw holes 40C for attaching the grounding protrusions 38 are included at the four corners of the outer marginal member 44C, described further below. Furthermore, as shown in FIG. 5D, screw holes 40D for attaching the grounding protrusions 38 are included at the four corners of the outer marginal member 44D, described further below. It is also possible to remove the grounding protrusions 38 from the bottom surface 18A of the casing 12 and attach the grounding protrusions 38 to the four corners of the outer marginal member 44C or the four corners of the outer marginal member 44D.

As shown in FIGS. 5A and 6, a ventilation path (ventilation port, intake port, intake path, or gap) 36A is included in the bottom surface 18A. The ventilation path 36A is formed by a partial ventilation path 36Ac and a partial ventilation path 36Ad. As shown in FIGS. 5C and 6, a ventilation path (ventilation port, intake port, intake path, or gap) 36C is included in the left-side surface 18C. As shown in FIGS. 5D and 6, a ventilation path (ventilation port, intake port, intake path, or gap) 36D is included in the right-side surface 18D.

Figure 8:
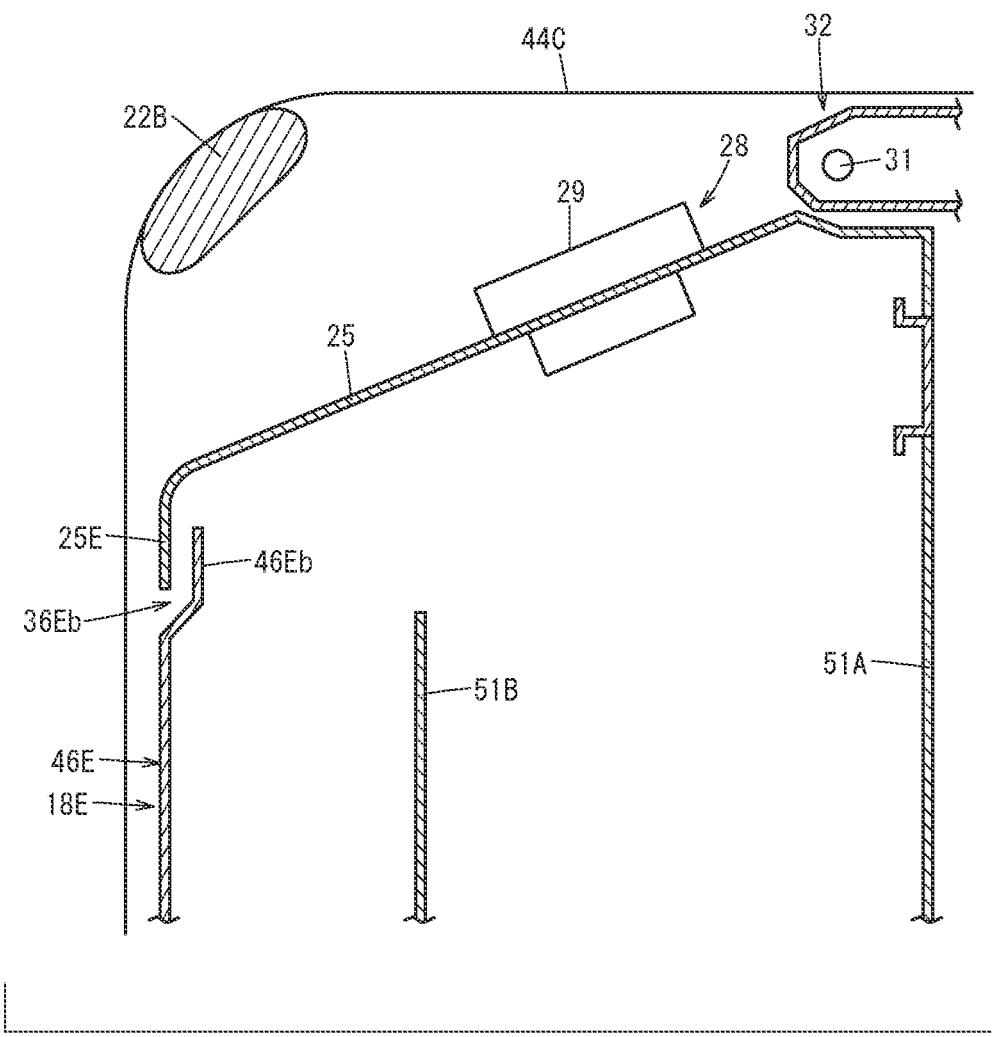
FIG. 8 is a cross-sectional view of a portion of the charging power supply device according to an embodiment.
Figure 9:
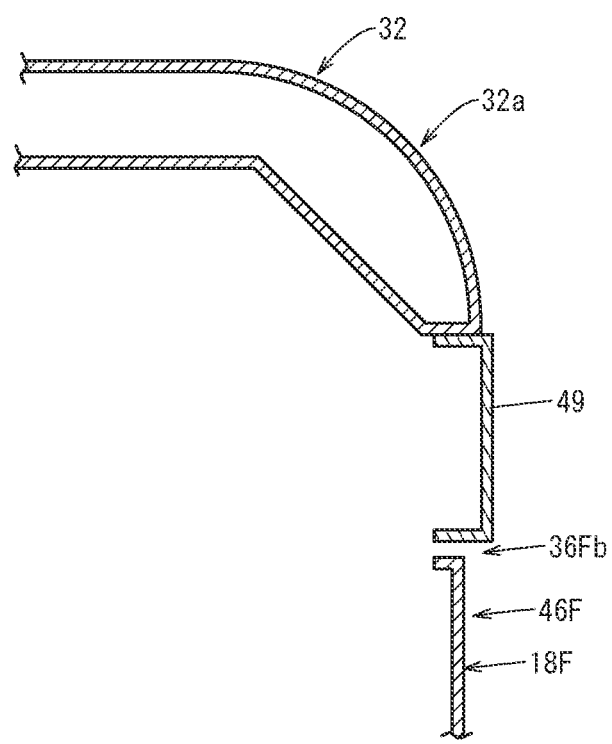
FIG. 9 is a cross-sectional view of a portion of the charging power supply device according to an embodiment.

FIG. 7 is a cross-sectional perspective view of the charging power supply device according to the present embodiment. In FIG. 7, a slit 59 (see FIG. 10) described further below and an opening 57d (see FIG. 10) described further below are omitted from the drawing. FIG. 8 is a cross-sectional view of a portion of the charging power supply device according to the present embodiment. FIG. 8 shows a cross section on the front surface 18E side. FIG. 9 is a cross-sectional view of a portion of the charging power supply device according to the present embodiment. FIG. 9 shows a cross section on the rear surface 18F side. As shown in FIG. 7, a ventilation path (ventilation port, exhaust port, exhaust path, or gap) 36E is included in the front surface 18E. The ventilation path 36E is formed by a partial ventilation path 36Ea and a partial ventilation path 36Eb. As shown in FIG. 7, a ventilation path (ventilation port, intake port, intake path, or gap) 36F is included in the rear surface 18F. The ventilation path 36F is formed by a partial ventilation path 36Fa and a partial ventilation path 36Fb. The reference numeral 36 is used when describing a ventilation path in general, and the reference numerals 36A, 36C, 36D, 36E, and 36F are used when describing each individual ventilation path. According to the present embodiment, the ventilation paths 36A, 36C, 36D, 36E, and 36F are included in the bottom surface 18A, the left-side surface 18C, the right-side surface 18D, the front surface 18E, and the rear surface 18F. Therefore, by using a blower 52 described further below to blow air, it is possible to bring air into the casing 12 via the ventilation paths 36A, 36C, 36D, and 36F, for example, and to expel the air from inside the casing 12 via the ventilation path 36E, for example. Therefore, according to the present embodiment, it is possible to favorably cool the inside of the casing 12.

Figure 10:
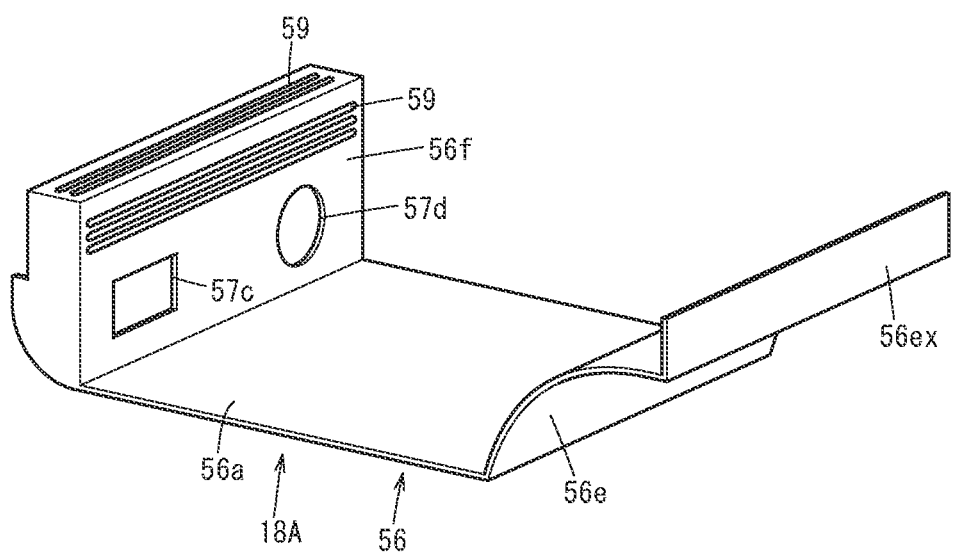
FIG. 10 shows members included on the bottom surface side of the casing.

FIG. 10 shows members included on the bottom surface side of the casing. A member 56 is included on the bottom surface 18A side of the casing 12. The member 56 includes a board-shaped portion 56a corresponding to the bottom surface 18A. The portion 56f bent from and continuous with this portion 56a is included at one side of the portion 56a, namely the rear surface 18F side. A portion 56e bent from and continuous with this portion 56a is included at the other side of the portion 56a, namely the front surface 18E side. The portion 56f is positioned on the rear surface 18F side, and the portion 56e is positioned on the front surface 18E side. The portion 56f includes an opening 57c, to which the AC power input terminal 34A is attached, and the opening 57d, to which the DC power input terminal 34B is attached. A plurality of slits 59 are formed in the portion 56f. Here, an example is shown of a case where five slits 59 are formed, but the number of slits 59 is not limited to five.

As shown in FIGS. 5C, 5D, and 6, the casing 12 includes the outer marginal members (frames) 44C and 44D and inner members (side covers or panels) 46C and 46D.

The outer marginal member 44C is formed by a ring-shaped (frame-shaped) member, for example. The inner member 46C is formed by a board-shaped member, for example. The portion of the outer marginal member 44C positioned on the left-side surface 18C forms the outer margin side of the left-side surface 18C. The inner member 46C is included on the inner side of the outer marginal member 44C. The ventilation path 36C is formed between the inner end of the outer marginal member 44C and the outer end of the inner member 46C. The outer margin of the inner member 46C is larger than the inner margin of the outer marginal member 44C. The inner member 46C is fixed to the casing 12 using an inset type of fixing mechanism (fixing structure) 47. The fixing mechanism 47 is included to correspond to the four corners of the inner member 46C, for example. By releasing the fixing realized by the fixing mechanism 47, it is possible to remove the inner member 46C from the casing 12. The portion of the inner member 46C overlapping with the outer marginal member 44C is positioned farther to the outside of the casing 12 relative to the portion of the outer marginal member 44C overlapping with the inner member 46C. Therefore, in the state where the outer marginal member 44C is fixed to the casing 12, it is possible to remove the inner member 46C.

Figure 11A:
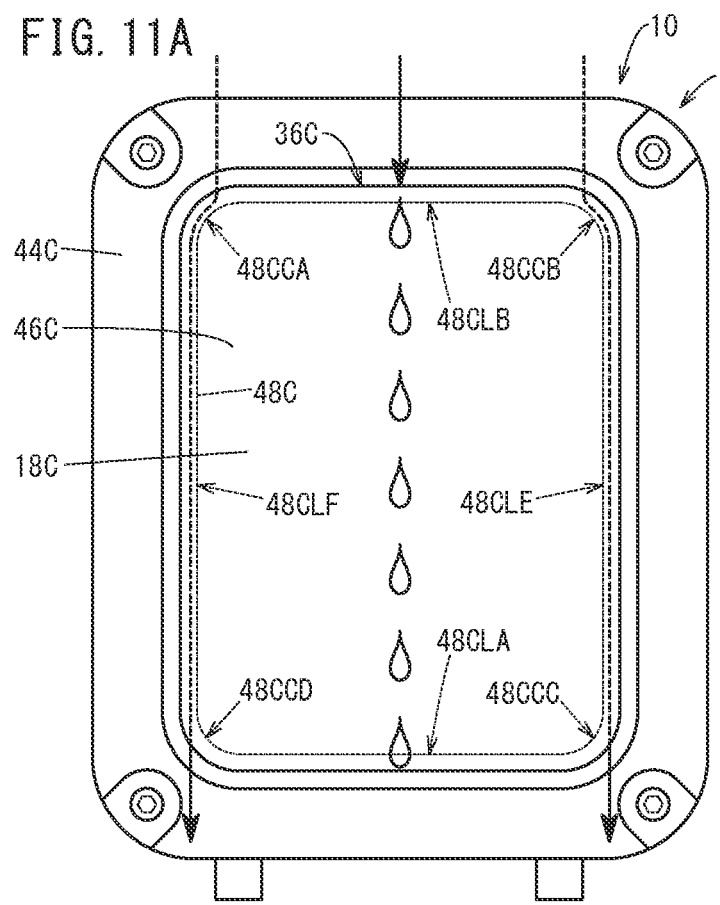
FIGS. 11A, 11B and 11C conceptually show the flow of water.
Figure 11B:
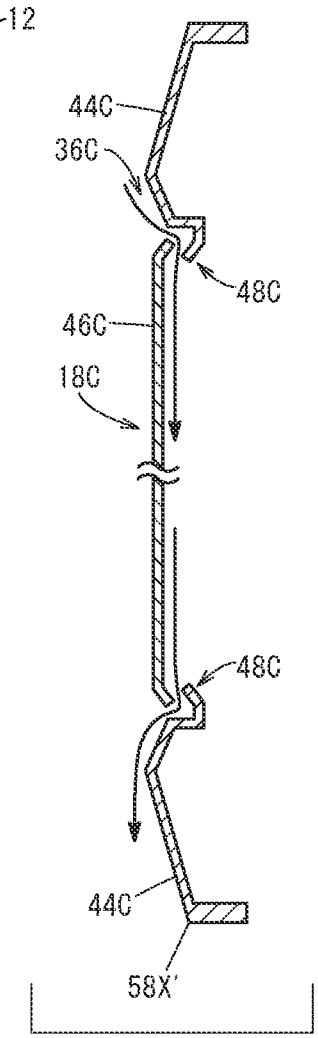
Figure 11C:
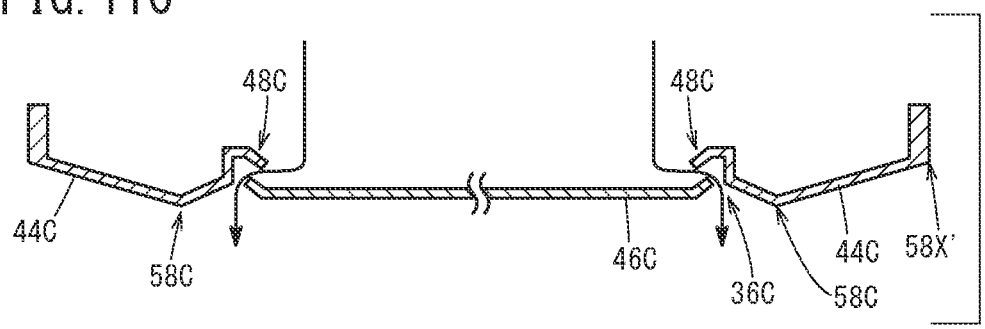

As shown in FIG. 6, the outer marginal member 44C includes a protruding portion (protruding part or barb) 48C that protrudes toward the inner member 46C, in the region where the inner member 46C and the outer marginal member 44C overlap. The protruding portion 48C is provided on the inner margin of the outer marginal member 44C. FIGS. 11A to 11C conceptually show the flow of water. FIG. 11A is a left side view. FIG. 11B is a cross-sectional view of the left-side surface 18C. As shown in FIG. 11A, the protruding portion 48C is formed with an annular shape in a manner to follow along the outer periphery of the inner member 46C. The corner portions of the protruding portion 48C formed with the annular shape are curved as shown in FIG. 11A. Specifically, the protruding portion 48C is formed by linear portions 48CLA, 48CLB, 48CLE, and 48CLF and curved portions 48CCA, 48CCB, 48CCC, and 48CCD. The linear portion 48CLA is a portion following along the bottom surface 18A. The linear portion 48CLB is a portion following along the top surface 18B. The linear portion 48CLE is a portion following along the front surface 18E. The linear portion 48CLF is a portion following along the rear surface 18F. The curved portion 48CCA is positioned near the region corresponding to the edge 20A. The curved portion 48CCB is positioned near the region corresponding to the edge 20B. The curved portion 48CCC is positioned near the region corresponding to the edge 20C. The curved portion 48CCD is positioned near the region corresponding to the edge 20D. Since the protruding portion 48C protruding toward the inner member 46C is included on the inner margin of the outer marginal member 44C, the water flowing into the casing 12 via the ventilation path 36C can flow in the manner described below. For example, water that flows into the portion of the ventilation path 36C corresponding to the linear portion 48CLB collides with the protruding portion 48C, and thereafter reaches the inner surface of the inner member 46C. The water having reached the inner surface of the inner member 46C can flow vertically along the inner surface of the inner member 46C (see FIG. 11B). Furthermore, water that flows into the portion of the ventilation path 36C corresponding to the curved portion 48CCA flows along the surface of the outer marginal member 44C while conforming to the shape of the curved portion 48CCA. Then the water flowing along the surface of the outer marginal member 44C while conforming to the shape of the curved portion 48CCA can flow along the surface of the outer marginal member 44C while conforming to the shape of the linear portion 48CLF. Furthermore, water that flows into the portion of the ventilation path 36C corresponding to the curved portion 48CCB flows along the surface of the outer marginal member 44C while conforming to the shape of the curved portion 48CCB. Then the water can flow along the surface of the outer marginal member 44C while conforming to the shape of the linear portion 48CLE. In this way, the protruding portion 48C realizes the role of a gutter.

The positional relationship between the inner member 46C and the outer marginal member 44C, in the direction from the right-side surface 18D toward the left-side surface 18C, is as described below. Specifically, the portion of the outer marginal member 44C positioned farthest in said direction is positioned on said direction side of the portion of the inner member 46C positioned farthest in said direction. In other words, in the normal direction of the left-side surface 18C, the most-protruding portion of the inner member 46C is positioned backward relative to the most-protruding portion of the outer marginal member 44C. Therefore, when the casing 12 is arranged with the left-side surface 18C side in contact with the floor, the outer marginal member 44C contacts the floor but the inner member 46C does not contact the floor. FIG. 11C shows a state in which the casing 12 is arranged with the left-side surface 18C on the bottom side. When water has flowed into the casing 12, this water can be expelled to the outside of the casing 12 via the ventilation path 36C, as shown in FIG. 11C.

The outer marginal member 44D and the outer marginal member 44C have mirror symmetry with respect to the left-right center of the casing 12. Furthermore, the inner member 46D and the inner member 46C have mirror symmetry relative to the left-right center of the casing 12. In a state where the outer marginal member 44D is fixed to the casing 12, the inner member 46D can be removed. The flow of water occurring when water flows into the casing 12 via the ventilation path 36D is the same as the flow of water occurring when water flows into the casing 12 via the ventilation path 36C.

As shown in FIGS. 7 and 8, a board-shaped member 46E is included on the front surface 18E side. A portion 46Eb of the member 46E positioned on the top surface 18B side overlaps with a portion 25E of the member 25 on the front surface 18E side. The portion 46Eb of the member 46E overlapping with the member 25 is positioned on the inner side of the casing 12 relative to the portion 25E of the member 25 overlapping with the member 46E. The partial ventilation path 36Eb is formed between the portion 46Eb of the member 46E positioned on the top surface 18B side and the portion 25E of the member 25 positioned on the front surface 18E side. In the manner described above, the ventilation path 36E is formed by the partial ventilation path 36Ea and the partial ventilation path 36Eb.

The positional relationship between the member 46E and the outer marginal members 44C and 44D, in the direction from the rear surface 18F toward the front surface 18E, is as described below. Specifically, the portions of the outer marginal members 44C and 44D positioned farthest in said direction are positioned on said direction side of the portion of the member 46E positioned farthest in said direction. In other words, in the normal direction of the front surface 18E, the most-protruding portion of the member 46E is positioned backward relative to the most-protruding portions of the outer marginal members 44C and 44D. Therefore, when the casing 12 is arranged such that the front surface 18E side contacts the floor, the outer marginal members 44C and 44D contact the floor, but the member 46E does not contact the floor and the ventilation path 36E does not become blocked by the floor. Therefore, according to the present embodiment, even when the casing 12 is arranged such that the front surface 18E side contacts the floor, the air expelled by the blower 52 described further below can be expelled to the outside of the casing 12 via the ventilation path 36E.

As shown in FIGS. 7 and 9, a board-shaped member 46F is included on the rear surface 18F side. The partial ventilation path 36Fa is formed between the portion 56f described above and the member 46F. The partial ventilation path 36Fa is included in the recessed space 54 described above. Since the partial ventilation path 36Fa is included inside the recessed space 54 and not on the surface of the casing 12, it is difficult for foreign matter to enter into the casing 12 via the partial ventilation path 36Fa. The partial ventilation path 36Fb is formed between a portion of the member 46F positioned on the top surface 18B side and a member 49 included to the top surface 18B side of the member 46F. The member 49 is positioned between the cover portion 32 and the member 46F. In the manner described above, the ventilation path 36F is formed by the partial ventilation path 36Fa and the partial ventilation path 36Fb.

As shown in FIG. 6, the partial ventilation path 36Ac is formed between the portion 56a and the outer marginal member 44C. Furthermore, the partial ventilation path 36Ad is formed between the portion 56a and the outer marginal member 44D. In the manner described above, the ventilation path 36A is formed by the partial ventilation path 36Ac and the partial ventilation path 36Ad. Since the casing 12 is not arranged with the top surface 18B facing the floor, there are no instances where the casing 12 is arranged such that the bottom surface 18A in which the ventilation path 36A is formed faces upward. Therefore, there is only a low possibility of foreign matter entering into the casing 12 via the ventilation path 36A, which means that there is only a low possibility of this foreign matter reaching a power converting apparatus 17 described further below. In the manner described above, the ventilation path 36A is formed by the partial ventilation path 36Ac and the partial ventilation path 36Ad.

As shown in FIGS. 7 and 10, a portion 46Ea of the member 46E positioned on the bottom surface 18A side overlaps with a portion 56ex of the member 56 on the front surface 18E side. The portion 46Ea of the member 46E overlapping with the member 56 is positioned on the inner side of the casing 12 relative to the portion 56ex of the member 56 overlapping with the member 46E. The partial ventilation path 36Ea is formed between the portion 46Ea of the member 46E positioned on the bottom surface 18A side and the portion 56ex of the member 56 positioned on the front surface 18E side.

The cross-sectional area (opening size) of the ventilation path 36E and the cross-sectional area of the ventilation path 36A differ from each other. More specifically, the cross-sectional area of the ventilation path 36A is smaller than the cross-sectional area of the ventilation path 36E. The cross-sectional area of the ventilation path 36C is equivalent to the cross-sectional area of the ventilation path 36D. The cross-sectional area of the ventilation path 36C and the cross-sectional area of the ventilation path 36E differ from each other. More specifically, the cross-sectional area of the ventilation path 36C is smaller than the cross-sectional area of the ventilation path 36E. The cross-sectional area of the ventilation path 36D and the cross-sectional area of the ventilation path 36E differ from each other. The cross-sectional area of the ventilation path 36D is smaller than the cross-sectional area of the ventilation path 36E. The cross-sectional area of the ventilation path 36E and the cross-sectional area of the ventilation path 36F differ from each other. More specifically, the cross-sectional area of the ventilation path 36F is smaller than the cross-sectional area of the ventilation path 36E. In this way, in the present embodiment, the cross-sectional areas of the ventilation paths 36A, 36C, 36D, and 36F for sucking in air using the blower 52 described further below are set to be relatively small. Therefore, according to the present embodiment, it is possible to restrict foreign matter from entering into the casing 12 via the ventilation paths 36A, 36C, 36D, and 36F. On the other hand, in the present embodiment, the cross-sectional area of the ventilation path 36E for expelling air using the blower 52 described further below is set to be relatively large. Therefore, according to the present embodiment, even in the extremely rare situation where foreign matter has entered into the casing 12, it is possible to effectively expel this foreign matter.

Figure 12A:
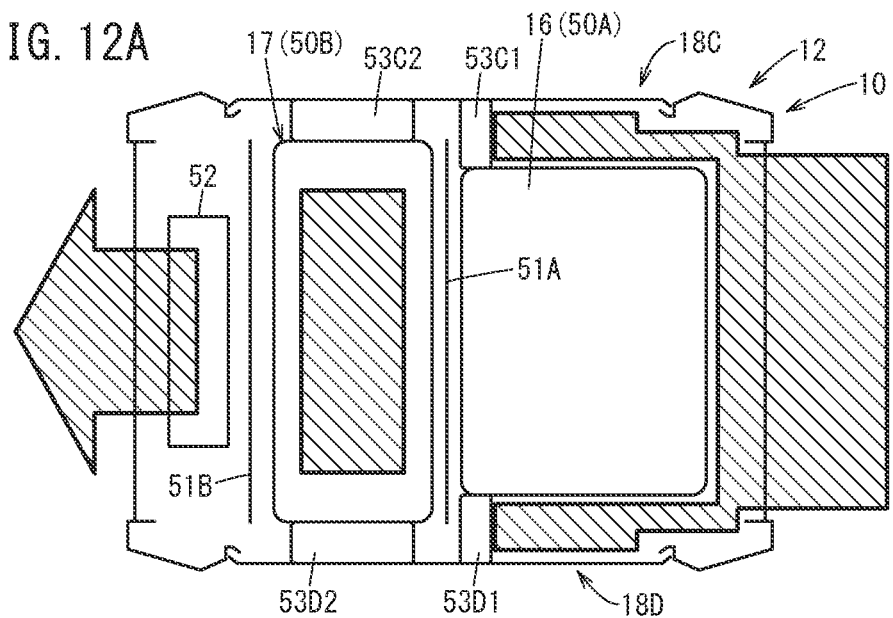
FIGS. 12A and 12B show the charging power supply device according to an embodiment.
Figure 12B:
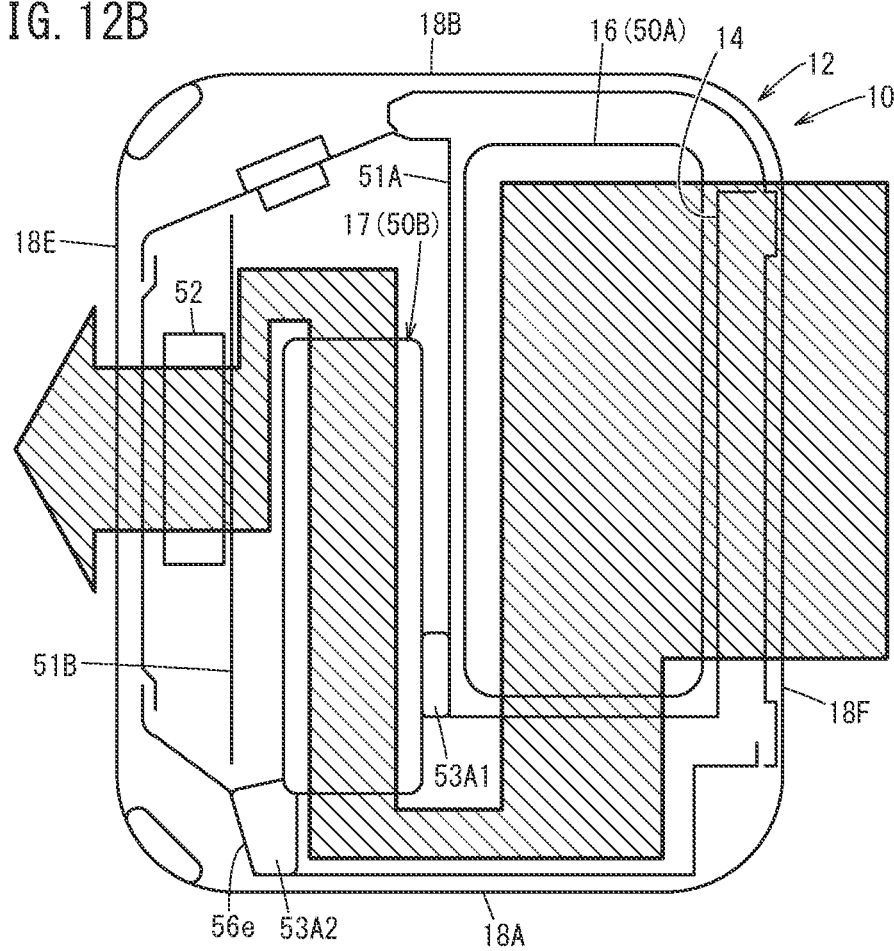

FIGS. 12A and 12B show the charging power supply device according to the present embodiment. FIG. 12A is a horizontal cross-sectional view seen from the top surface 18B side. FIG. 12B is a vertical cross-sectional view seen from the right-side surface 18D side. In FIGS. 12A and 12B, the arrows with hatching conceptually show the flow of air.

As shown in FIGS. 12A and 12B, a plurality of heating bodies 50A and 50B are included. The reference numeral 50 is used when describing a heating body in general, and the reference numerals 50A and 50B are used when describing each individual heating body. Furthermore, the blower (fan) 52 for cooling the heating bodies 50A and 50B is also included in the casing 12. The blower 52 sends air from the right side to the left side in FIGS. 12A and 12B. The heating bodies 50A and 50B are positioned downstream from the ventilation paths 36A, 36C, 36D, and 36F. The heating bodies 50A and 50B are positioned upstream from the blower 52. The heating body 50A is the battery 16, for example. The heating body 50B is the power converting apparatus (invertor converter unit) 17, for example. The heating body 50B will reach a higher temperature than the heating body 50A. The heating body 50A is arranged upstream from the heating body 50B. There is a partition wall 51A between the containment chamber 14 in which the heating body 50A is housed and the portion (containment chamber) where the heating body 50B is housed. There is a partition wall 51B between the portion where the heating body 50B is housed and the portion where the blower 52 is housed. As shown in FIG. 12A, a barrier member (sealing material) 53C1 is included between the portion of the heating body 50A on the front surface 18E side and the left-side surface 18C. A barrier member 53D1 is included between the portion of the heating body 50A on the front surface 18E side and the right-side surface 18D. A barrier member 53C2 is included between the heating body 50B and the left-side surface 18C. A barrier member 53D2 is included between the heating body 50B and the right-side surface 18D. As shown in FIG. 12B, a barrier member 53A1 is included between the bottom end portion of the partition wall 51A and the heating body 50B. A barrier member 53A2 is included between the portion of the heating body 50B on the front surface 18E side and the portion 56e. The barrier members 53C1, 53D1, 53C2, 53D2, 53A1, and 53A2 are for blocking the flow of air. The barrier members 53C1, 53D1, 53C2, 53D2, 53A1, and 53A2 can be formed by a foam sealant, for example, but are not limited to this. Since the heating bodies 50A and 50B, the blower 52, the partition walls 51A and 51B, and the barrier members 53A1, 53A2, 53C1, 53C2, 53D1, and 53D2 are arranged this way, the air flows inside the casing 12 as shown by the arrow marks.

FIGS. 13A to 13F show six orthogonal views of the charging power supply device according to the present embodiment. FIG. 13A is a bottom view, FIG. 13B is a top view, FIG. 13C is a left side view, FIG. 13D is a right side view, FIG. 13E is a front view, and FIG. 13F is a rear view. FIG. 13 shows a state in which the grounding protrusions 38 (see FIGS. 5C to 5F) are removed.

When the casing 12 is arranged such that the bottom surface 18A is in contact with the floor, the positional relationship between the outer marginal members 44C and 44D and the floor, in the direction from the top surface 18B toward the bottom surface 18A, is as described below. Specifically, a portion (region) 58Ac (see FIG. 14) of the outer marginal member 44C positioned farthest in said direction and a portion 58Ad of the outer marginal member 44D positioned farthest in said direction are in contact with the floor. These portions 58Ac and 58Ad are linear, as shown in FIG. 13A. Since the entire bottom surface 18A does not contact the floor and the liner portions 58Ac and 58Ad do contact the floor, the frictional force occurring when the casing 12 is slid in the longitudinal direction of these portions 58Ac and 58Ad is relatively small. Accordingly, when the casing 12 is slid in the direction of an arrow mark 60A shown in FIG. 13A, it is possible for the casing 12 to be slid with relatively little force. In this way, when the casing 12 is arranged such that the bottom surface 18A is in contact with the floor, the casing 12 can be slid in the direction from the front surface 18E toward the rear surface 18F with relatively little force. Furthermore, when the casing 12 is arranged such that the bottom surface 18A is in contact with the floor, the casing 12 can be slid in the direction from the rear surface 18F toward the front surface 18E with relatively little force.

Figure 14:
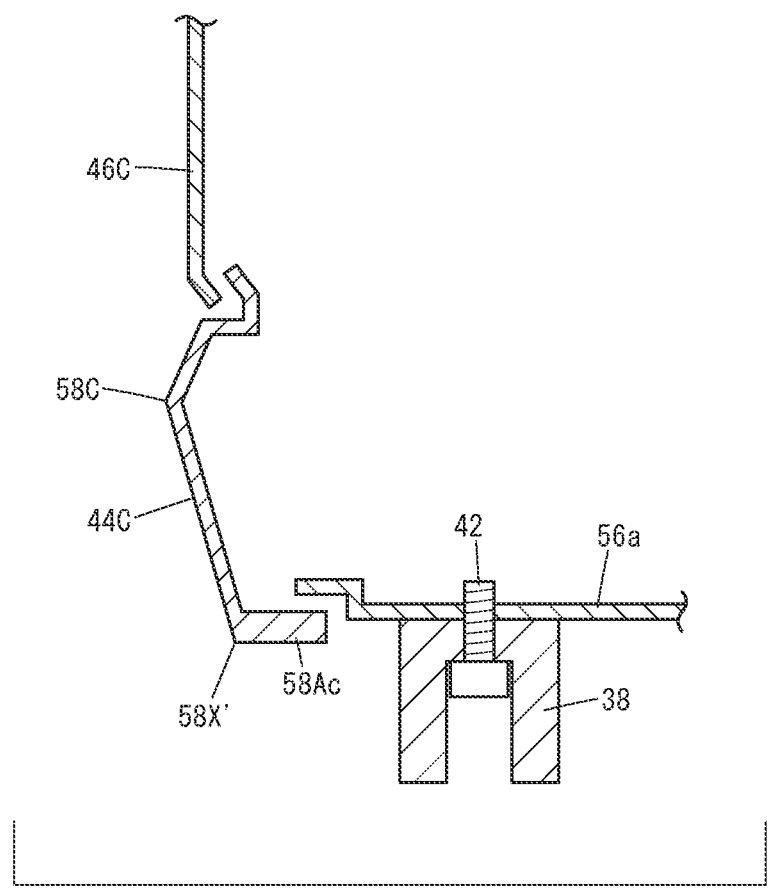
FIG. 14 is a cross-sectional view of a portion of the charging power supply device according to an embodiment.

When the casing 12 is arranged such that the left-side surface 18C is in contact with the floor, the positional relationship between the outer marginal member 44C and the floor, in the direction from the right-side surface 18D toward the left-side surface 18C, is as described below. Specifically, a portion 58C (see FIG. 11C) of the outer marginal member 44C positioned farthest in said direction is in contact with the floor. FIG. 14 is a cross-sectional view of a portion of the charging power supply device according to the present embodiment. FIG. 14 shows a state in which the grounding protrusion 38 is attached to the bottom surface 18A side. As shown in FIG. 13C, the portion 58C is a substantially rectangular frame, that is, a substantially rectangular ring. Since the entire left-side surface 18C is not in contact with the floor and the ring-shaped portion 58C is in contact with the floor, the frictional force is relatively low when the casing 12 slides. Accordingly, when the casing 12 is slid in the direction of an arrow mark 60C shown in FIG. 13C, the casing 12 can be slid with relatively little force. In this way, when the casing 12 is arranged such that the left-side surface 18C is in contact with the floor, the casing 12 can be slid in the direction from the front surface 18E toward the rear surface 18F with relatively little force. Furthermore, when the casing 12 is arranged such that the left-side surface 18C is in contact with the floor, the casing 12 can be slid in the direction from the rear surface 18F toward the front surface 18E with relatively little force. When the casing 12 is arranged such that the left-side surface 18C is in contact with the floor, the casing 12 can be slid in the direction from the bottom surface 18A toward the top surface 18B with relatively little force. When the casing 12 is arranged such that the left-side surface 18C is in contact with the floor, the casing 12 can be slid in the direction from the top surface 18B toward the bottom surface 18A with relatively little force.

When the casing 12 is arranged such that the left-side surface 18C is in contact with the floor, the ring-shaped portion 58C contacts the floor, and therefore the air intake via the ventilation path 36C included in the left-side surface 18C is restricted. Due to this, in such a case, foreign matter is restricted from entering into the casing 12 via the ventilation path 36C.

When the casing 12 is arranged such that the right-side surface 18D is in contact with the floor, the positional relationship between the outer marginal member 44D and the floor, in the direction from the left-side surface 18C toward the right-side surface 18D, is as described below. Specifically, a portion 58D of the outer marginal member 44D positioned farthest in said direction is in contact with the floor. The right-side surface 18D and the left-side surface 18C have mirror symmetry with respect to the left-right center of the casing 12. Accordingly, when the casing 12 is arranged such that the right-side surface 18D is in contact with the floor, the casing 12 can be slid with relatively little force, in the same manner as when the casing 12 is arranged such that the left-side surface 18C is in contact with the floor. Furthermore, when the casing 12 is arranged such that the right-side surface 18D is in contact with the floor, foreign matter is restricted from entering into the casing 12 via the ventilation path 36D, in the same manner as when the casing 12 is arranged such that the left-side surface 18C is in contact with the floor.

When the casing 12 is arranged such that the front surface 18E is in contact with the floor, the positional relationship between the outer marginal members 44C and 44D and the floor, in the direction from the rear surface 18F toward the front surface 18E, is as described below. Specifically, a portion 58Ec of the outer marginal member 44C positioned farthest in said direction and a portion 58Ed of the outer marginal member 44D positioned farthest in said direction are in contact with the floor. These portions 58Ec and 58Ed are linear, as shown in FIG. 13E. Since the entire front surface 18E is not in contact with the floor and the linear portions 58Ec and 58Ed are in contact with the floor, the frictional force is relatively small when the casing 12 is slid in the longitudinal direction of these portions 58Ec and 58Ed. Accordingly, when the casing 12 is slid in the direction of an arrow mark 60E shown in FIG. 13E, it is possible for the casing 12 to be slid with relatively little force. In this way, when the casing 12 is arranged such that the front surface 18E is in contact with the floor, the casing 12 can be slid in the direction from the bottom surface 18A toward the top surface 18B with relatively little force. Furthermore, when the casing 12 is arranged such that the front surface 18E is in contact with the floor, the casing 12 can be slid in the direction from the top surface 18B toward the bottom surface 18A with relatively little force.

When the casing 12 is arranged such that the rear surface 18F is in contact with the floor, the positional relationship between the outer marginal members 44C and 44D and the floor, in the direction from the front surface 18E toward the rear surface 18F, is as described below. Specifically, a portion 58Fc of the outer marginal member 44C positioned farthest in said direction and a portion 58Fd of the outer marginal member 44D positioned farthest in said direction are in contact with the floor. These portions 58Fc and 58Fd are linear, as shown in FIG. 13F. Since the entire rear surface 18F is not in contact with the floor and the linear portions 58Fc and 58Fd are in contact with the floor, the frictional force is relatively small when the casing 12 is slid in the longitudinal direction of these portions 58Fc and 58Fd. Accordingly, when the casing 12 is slid in the direction of an arrow mark 60F shown in FIG. 13F, it is possible for the casing 12 to be slid with relatively little force. In this way, when the casing 12 is arranged such that the rear surface 18F is in contact with the floor, the casing 12 can be slid in the direction from the bottom surface 18A toward the top surface 18B with relatively little force. Furthermore, when the casing 12 is arranged such that the rear surface 18F is in contact with the floor, the casing 12 can be slid in the direction from the top surface 18B toward the bottom surface 18A with relatively little force.

Figure 15:
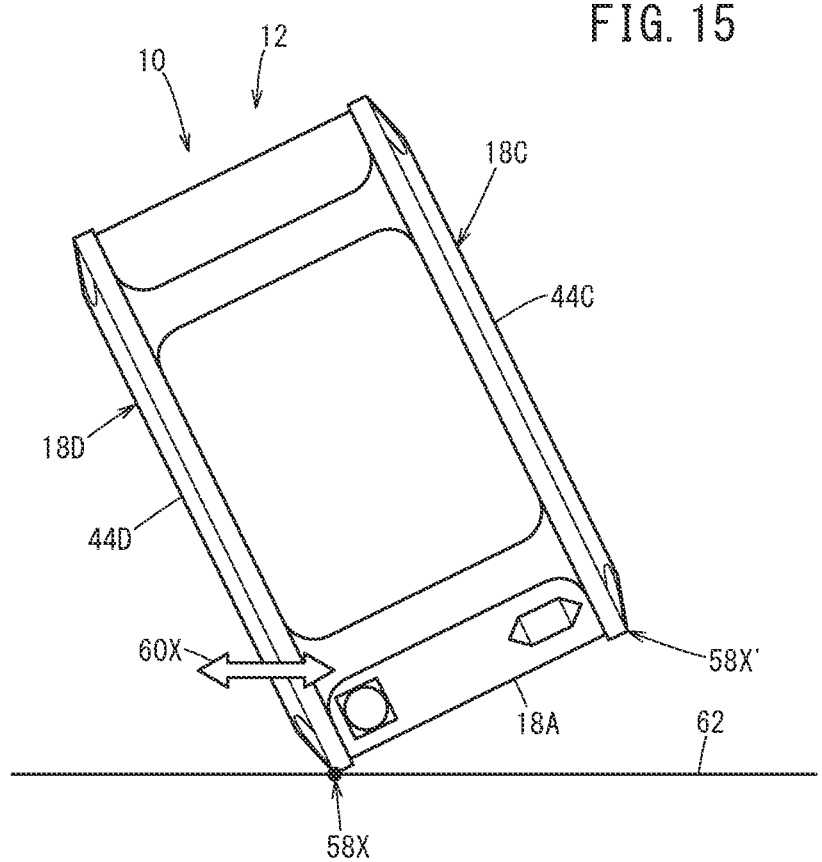
FIG. 15 shows a state in which the casing is inclined.

FIG. 15 shows a state in which the casing is inclined. FIG. 15 shows a state in which the casing 12 is inclined such that only the region corresponding to the edge 20G, which is positioned at the region where the bottom surface 18A and the right-side surface 18D intersect, is in contact with a floor 62. When the casing 12 is inclined in this way, the positional relationship between the outer marginal member 44D and the floor 62, in the direction from the casing 12 toward the floor 62, is as described below. Specifically, a portion 58X of the outer marginal member 44D positioned farthest in said direction is in contact with the floor 62. This portion 58X is linear. Since the portion 58X in contact with the floor 62 is linear, the frictional amount is relatively small when the casing 12 is slid in a direction intersecting the longitudinal direction of this portion 58X. Accordingly, when the casing 12 is slid in the direction of an arrow mark 60X shown in FIG. 15, the casing 12 can be slid with relatively little force. When the casing 12 is inclined to the opposite side, the positional relationship between the outer marginal member 44C and the floor 62, in the direction from the casing 12 toward the floor 62, is as described below. Specifically, a portion 58X' of the outer marginal member 44C positioned farthest in said direction is in contact with the floor 62. This portion 58X' is linear. Since the portion 58X' in contact with the floor 62 is linear, the frictional amount is relatively small when the casing 12 is slid in a direction intersecting the longitudinal direction of this portion 58X'. Accordingly, even in a case where the casing 12 is inclined to the opposite side, when the casing 12 is slid in the direction of the arrow mark 60X shown in FIG. 15, the casing 12 can be slid with relatively little force.

Figure 16:
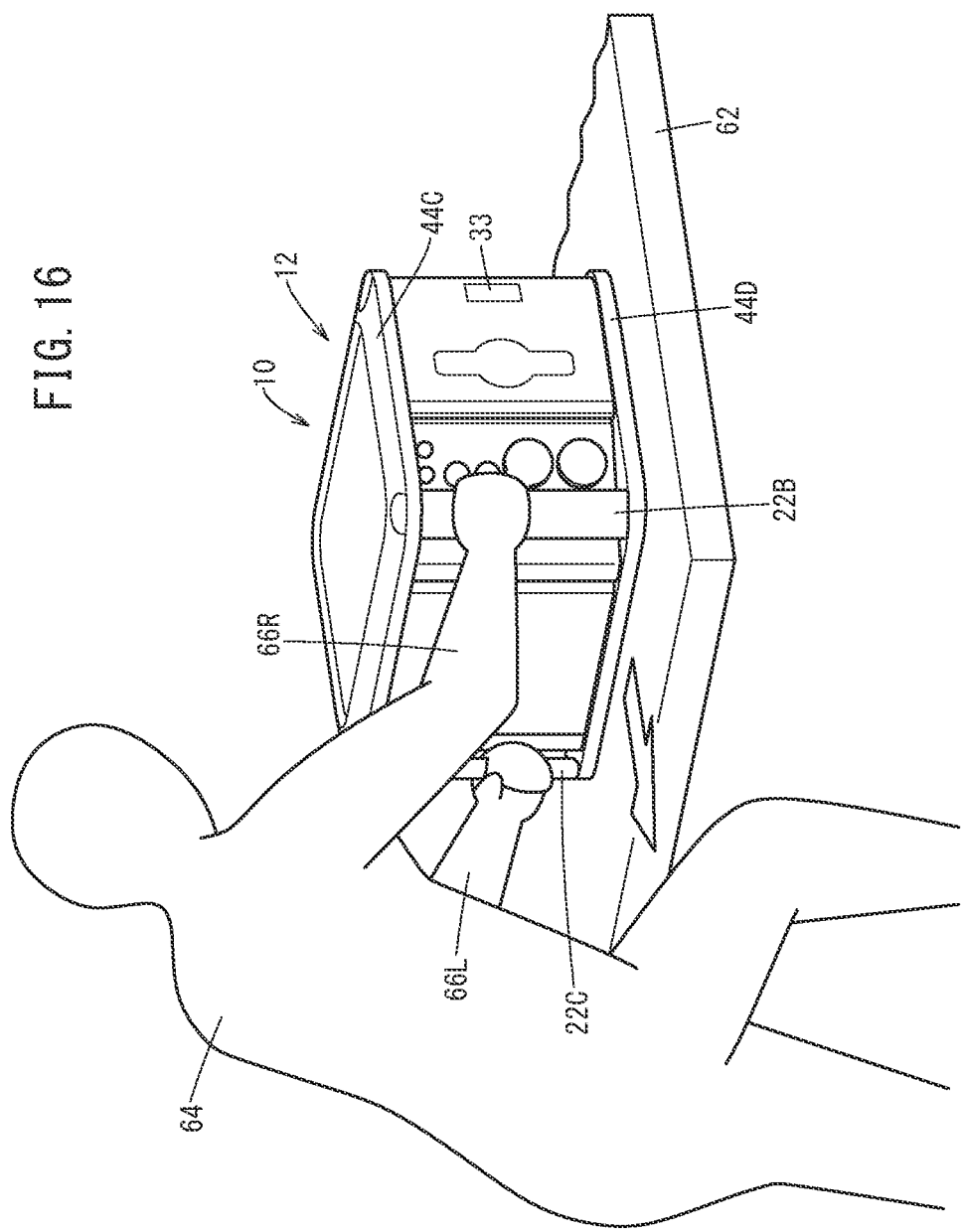
FIG. 16 shows an example of a case of transporting the charging power supply device according to an embodiment.

FIG. 16 shows an example of a case of transporting the charging power supply device according to the present embodiment. FIG. 16 shows an example of a case in which the casing 12 is arranged on the floor 62 such that the right-side surface 18D is on the bottom. The floor 62 shown in FIG. 16 is a loading platform or the like of an automobile, for example, but is not limited to this. FIG. 16 shows an example of a case in which the height of the floor 62 on which the casing 12 is arranged is greater than the height of the floor (not shown in the drawings) on which a user 64 is standing. FIG. 16 shows an example of a case in which the handle portion 22B is gripped by a right hand 66R of the user 64, and the handle portion 22C is gripped by a left hand 66L of the user 64. While gripping the handle portions 22B and 22C, the user 64 can pull the charging power supply device 10 out from the loading platform or the like of the automobile.

Figure 17:
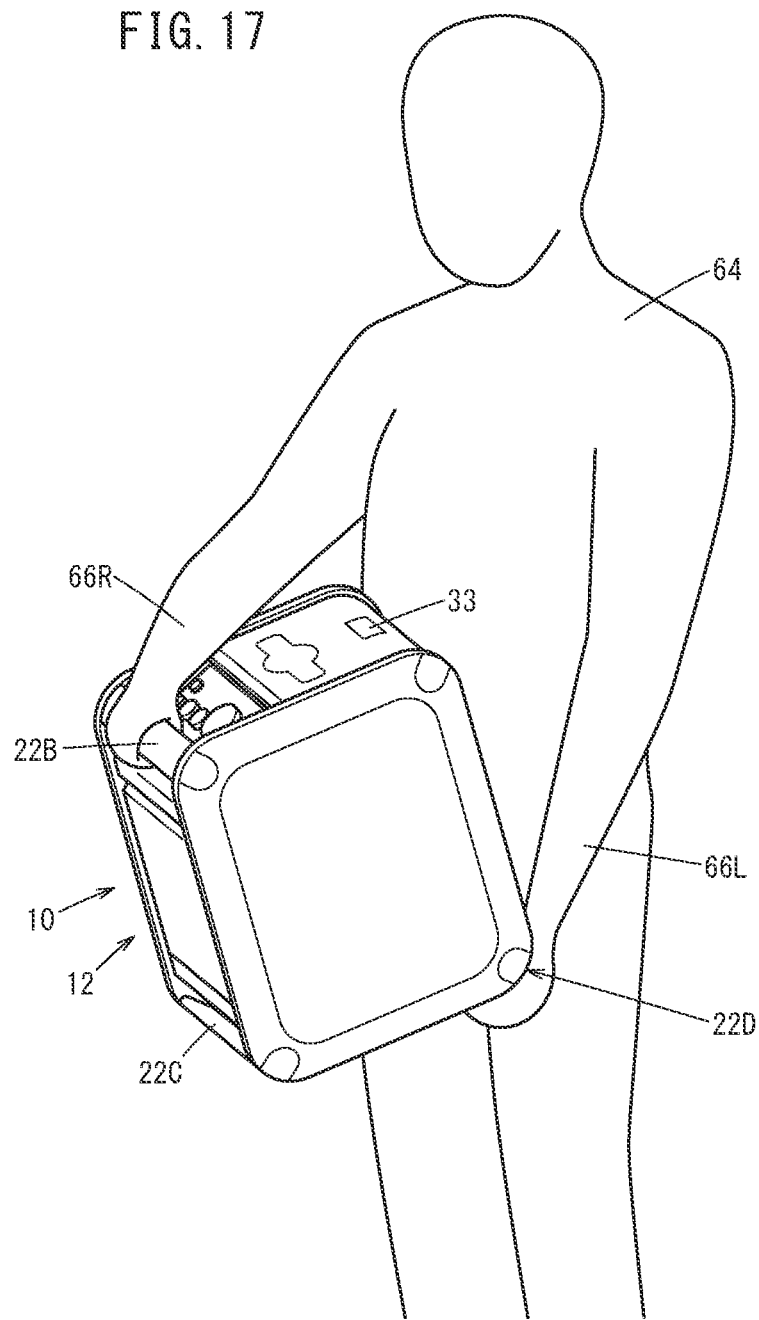
FIG. 17 shows an example of a case of transporting the charging power supply device according to an embodiment.

FIG. 17 shows an example of a case of transporting the charging power supply device according to the present embodiment. FIG. 17 shows an example of a case in which the user 64 carries the charging power supply device 10 alone. FIG. 17 shows an example of a case where the handle portion 22B is gripped by the right hand 66R of the user 64 and the handle portion 22D is gripped by the left hand 66L of the user 64. While gripping the handle portions 22B and 22D, the user 64 can carry the charging power supply device 10.

Figure 18:
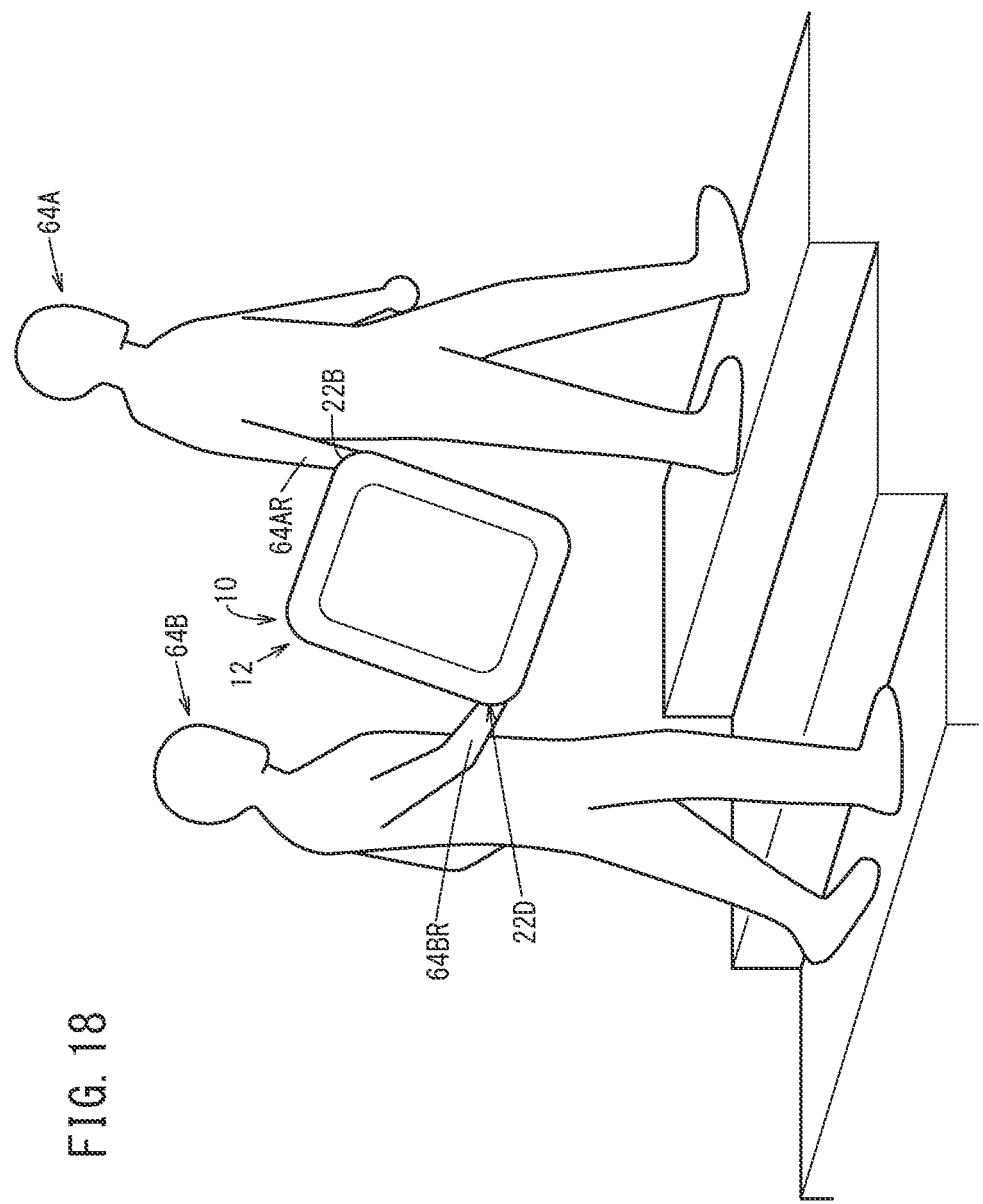
FIG. 18 shows an example of a case of transporting the charging power supply device according to an embodiment.

FIG. 18 shows an example of a case of transporting the charging power supply device according to the present embodiment. FIG. 18 shows an example where two users 64A and 64B cooperate to carry the charging power supply device 10. FIG. 18 shows an example of a case where, when climbing a staircase, the user 64A is positioned in front and the user 64B is positioned to the rear. FIG. 18 shows an example of a case in which the handle portion 22B is gripped by a right hand 64AR of the user 64A and the handle portion 22D is gripped by a right hand 64BR of the user 64B. The users 64A and 64B can carry the charging power supply device 10 in this way as well.

Figure 19:
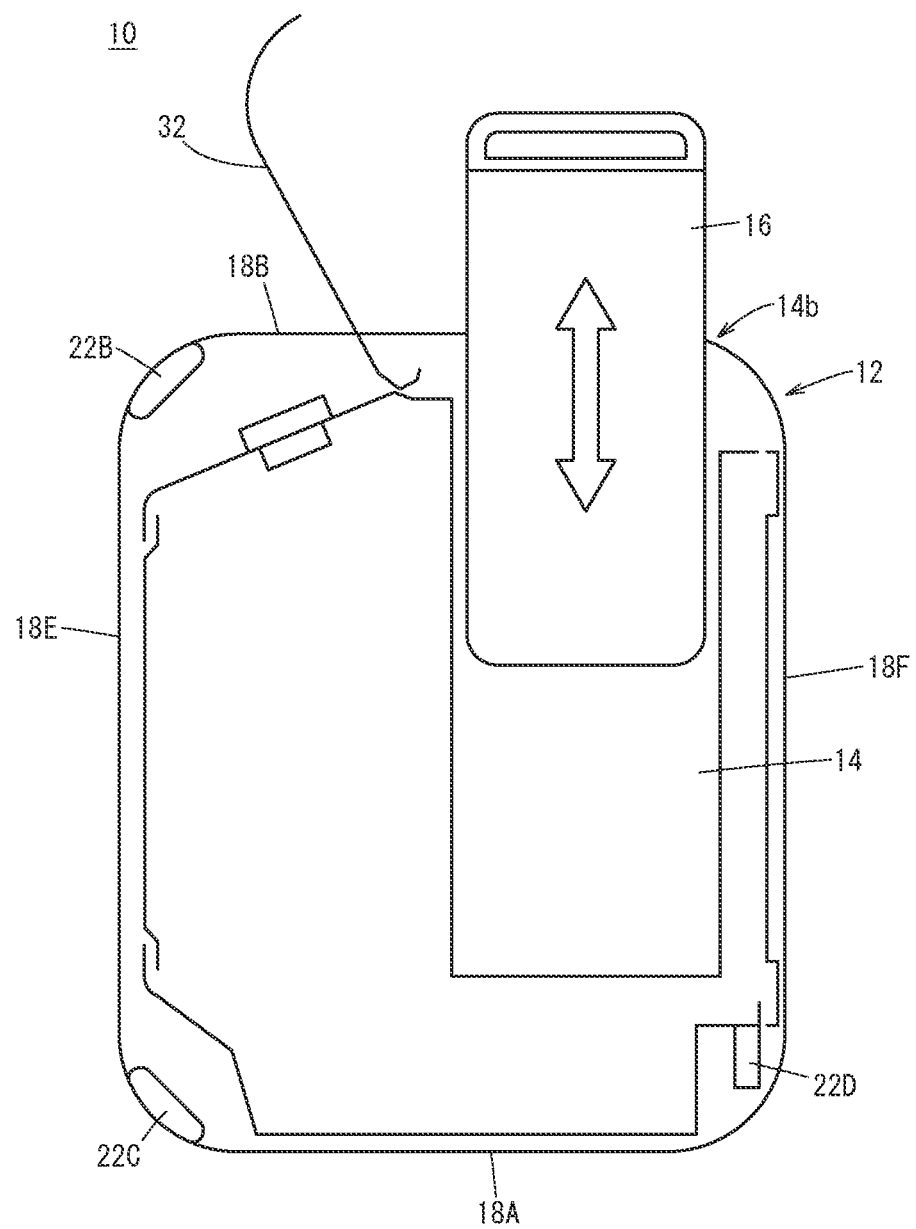
FIG. 19 shows an example of inserting or removing a battery into and from a containment chamber.

FIG. 19 shows an example of inserting or removing a battery into and from a containment chamber. FIG. 19 shows an example of a case where the casing 12 is arranged such that the bottom surface 18A faces the floor 62. FIG. 19 shows an example of a case in which the battery 16 is inserted or removed into or from the containment chamber 14 in the depth direction of the containment chamber 14 (in the vertical direction). The user can insert or remove the battery 16 into or from the containment chamber 14 in this way.

Figure 20:
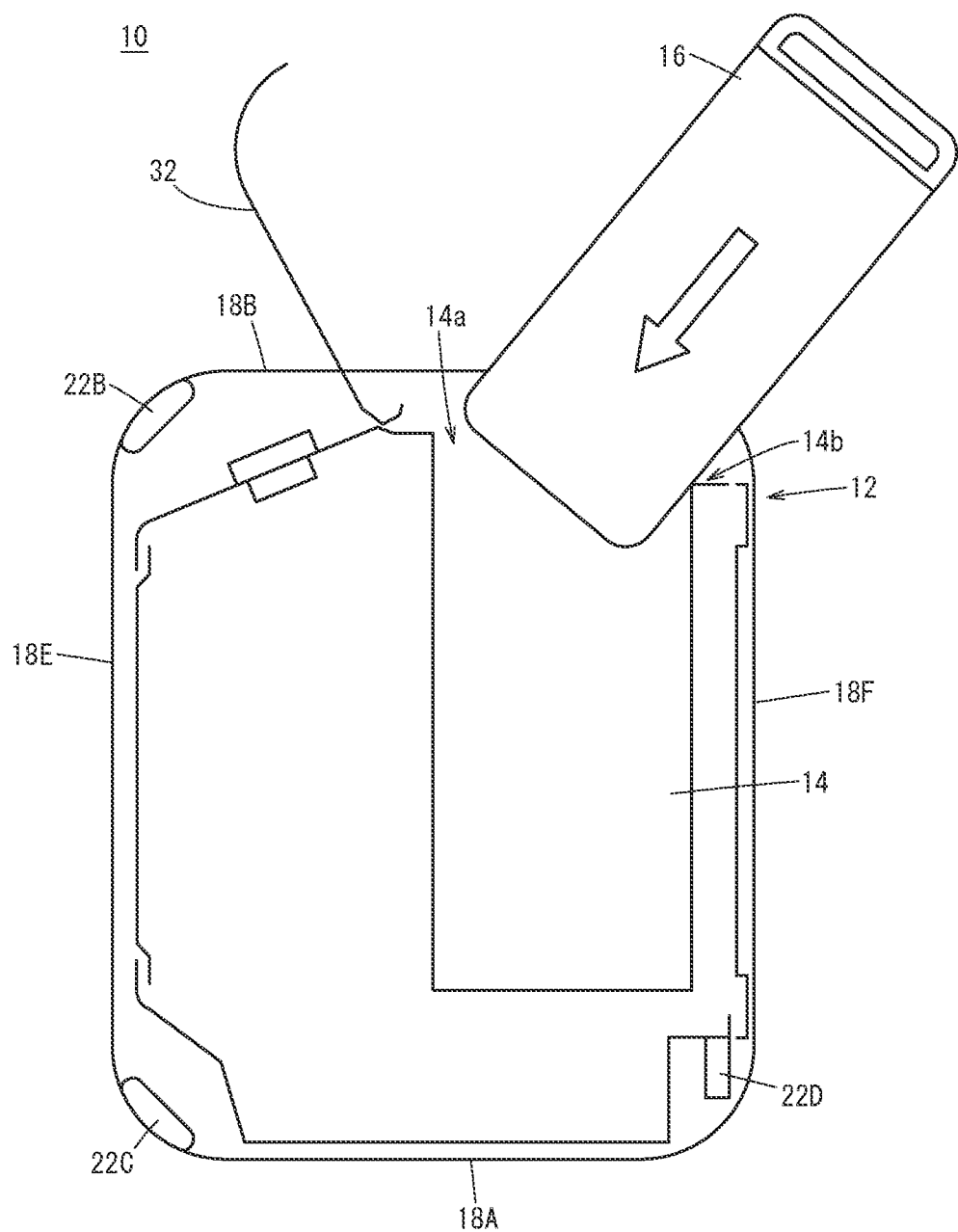
FIG. 20 shows an example of inserting the battery into the containment chamber.

FIG. 20 shows an example of inserting the battery into the containment chamber. FIG. 20 shows an example of a case where the casing 12 is arranged such that the bottom surface 18A faces the floor 62. As described above, the opening 14a continuous with the containment chamber 14, or the peripheral edge portion 14b of the opening 14a continuous with the containment chamber 14, is positioned at the portion corresponding to the edge 20A. The handle portions 22B to 22D are not provided at the position corresponding to the edge 20A. Since the opening 14a continuous with the containment chamber 14, or the peripheral edge portion 14b of the opening 14a continuous with the containment chamber 14, is positioned at the portion corresponding to the edge 20A, the portion of the inner side surface of the containment chamber 14 on the rear surface 18F side can function as a guide portion (guiding portion) when inserting the battery 16. In this way, the battery 16 can be inserted into the containment chamber 14 from a direction inclined relative to the depth direction of the containment chamber 14. In other words, the battery 16 can be inserted into the containment chamber 14 from a direction other than the depth direction of the containment chamber 14.

Figure 21:
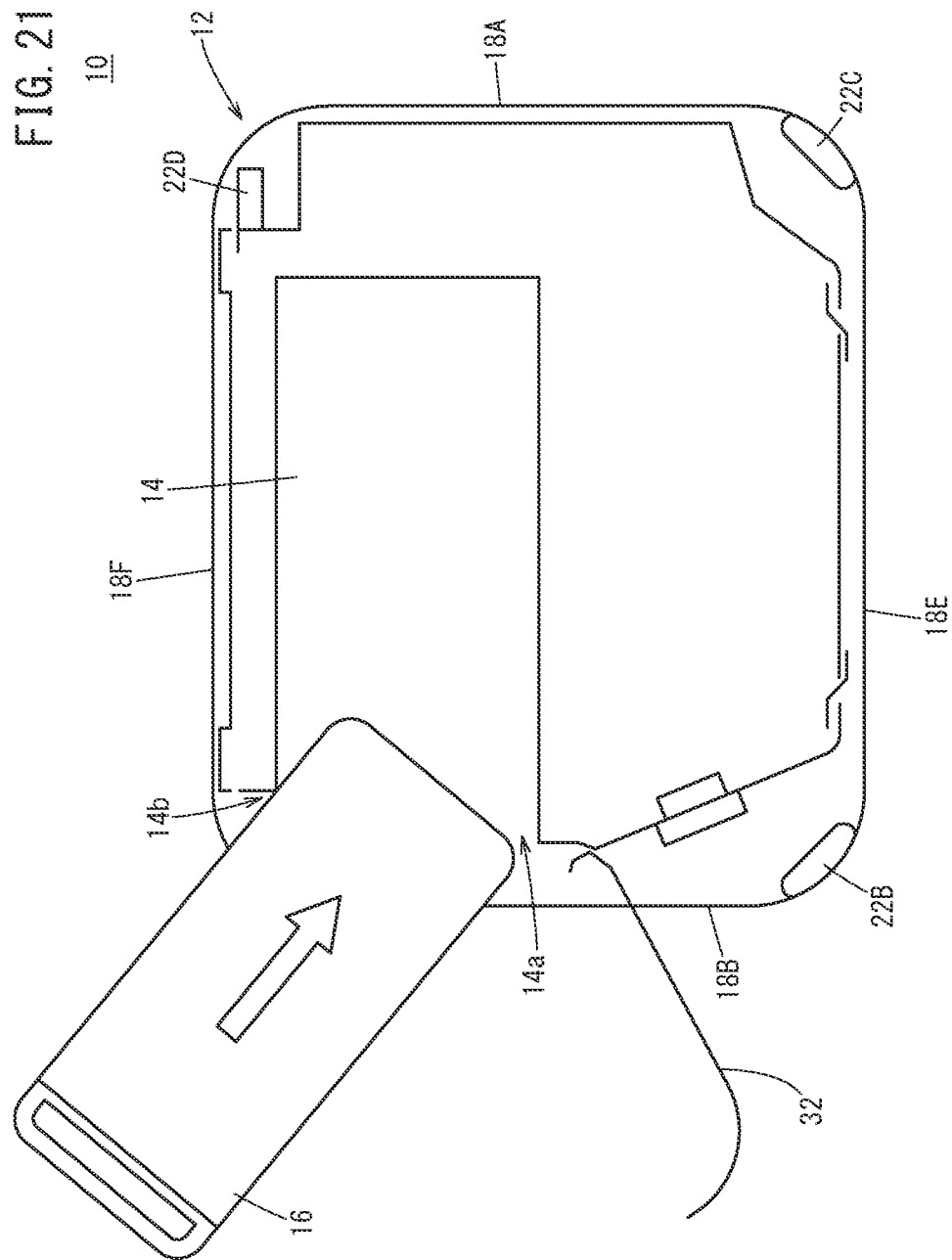
FIG. 21 shows an example of inserting the battery into the containment chamber.

FIG. 21 shows an example of inserting the battery into the containment chamber. FIG. 21 shows an example of a case where the casing 12 is arranged such that the front surface 18E faces the floor 62. As described above, the opening 14a continuous with the containment chamber 14, or the peripheral edge portion 14b of the opening 14a continuous with the containment chamber 14, is positioned at the portion corresponding to the edge 20A. A handle portion 22 is not provided at the portion corresponding to the edge 20A. Since the opening 14a continuous with the containment chamber 14, or the peripheral edge portion 14b of the opening 14a continuous with the containment chamber 14, is positioned at the portion corresponding to the edge 20A, the portion of the inner side surface of the containment chamber 14 on the rear surface 18F side can function as the guide portion when inserting the battery 16. In this way, the battery 16 can be inserted into the containment chamber 14 from a direction inclined relative to the depth direction of the containment chamber 14. In other words, the battery 16 can be inserted into the containment chamber 14 from a direction other than the depth direction of the containment chamber 14.

Figure 22:
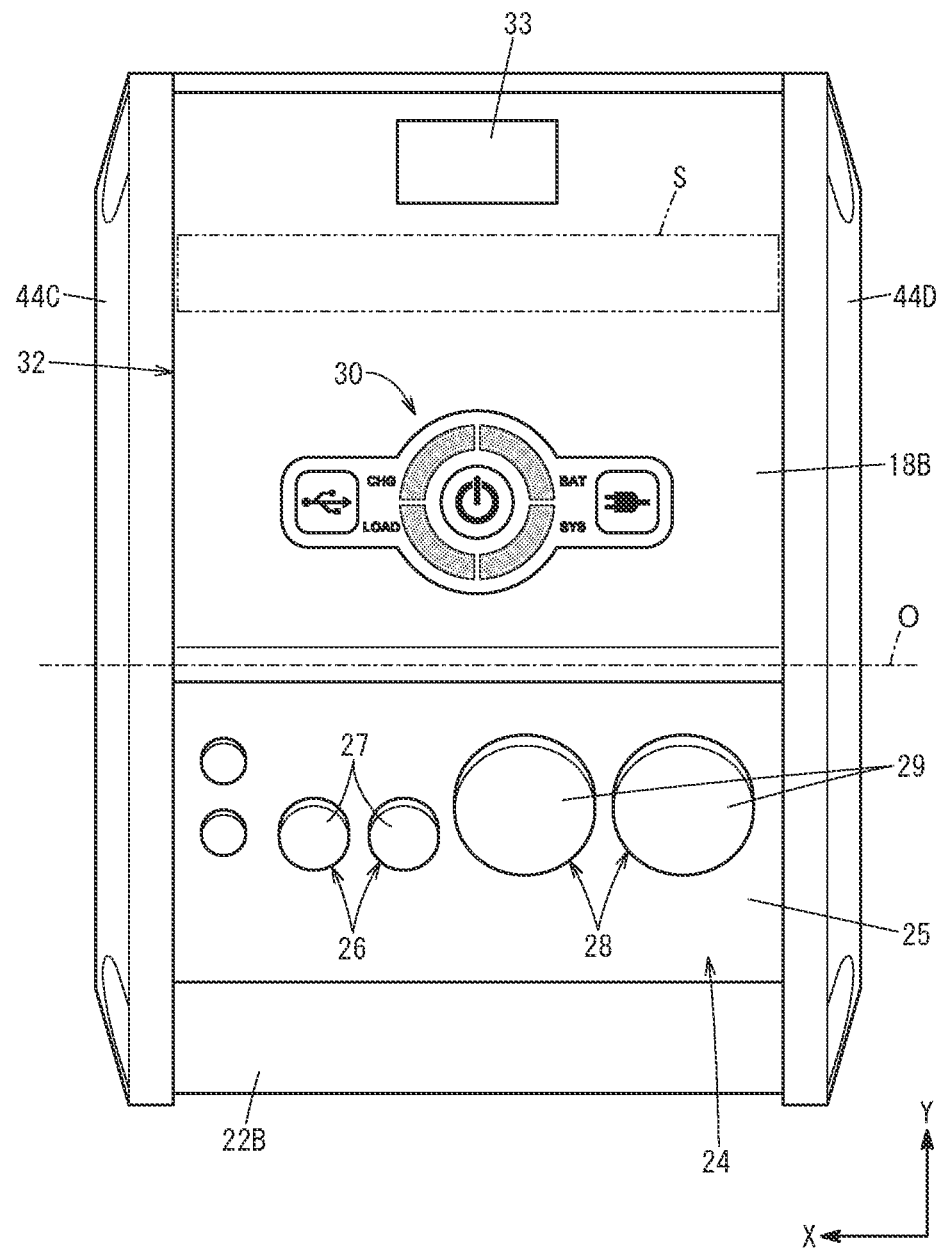
FIG. 22 is a top view of the charging power supply device according to an embodiment.

FIG. 22 is a top view of the charging power supply device according to the present embodiment. FIG. 22 shows a state in which the cover portion 32 is closed. FIG. 22 shows a straight line O as a position of the pivoting shaft 31 (FIG. 8) on which the cover portion 32 pivots. Further, FIG. 22 shows a range S where the cover portion 32 and the handle portion 22B are in contact with each other in a state in which the cover portion 32 is most pivoted in an opening direction thereof.

As shown in FIG. 22, when the cover portion 32 is closed, the indicator 30 is disposed at a substantially central portion in the X direction of the cover portion 32, and disposed near the pivoting shaft of the cover portion 32 in the Y direction of the cover portion 32. Accordingly, when the cover portion 32 is most pivoted in the opening direction thereof, the handle portion 22B comes into contact with a position (range S) of the cover portion 32 that is opposite to the pivoting shaft across the position of the indicator 30. In this case, the indicator 30 faces the recessed portion 24. Therefore, since the indicator 30 does not come into contact with other members, it is possible to prevent any force from directly applying to the indicator 30.

The pivoting shaft of the cover portion 32 is provided on the recessed portion 24 side of the cover portion 32 where the USB power output terminals 26 and the AC power output terminals 28 are arranged. Accordingly, when the cover portion 32 is pivoted in the opening direction, the user can see the indicator 30 from the USB power output terminals 26 side and the AC power output terminals 28 side.

Figure 23:
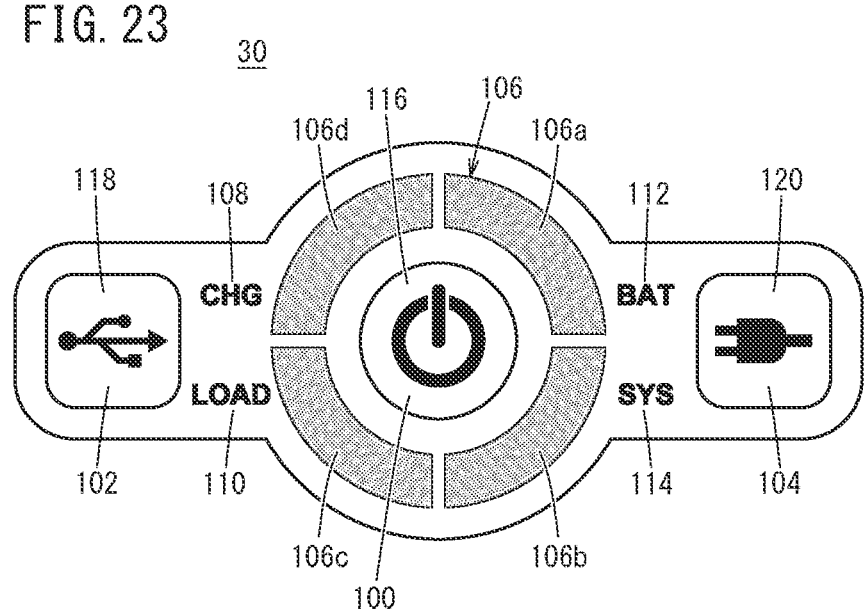
FIG. 23 shows an indicator.
Figure 27A:
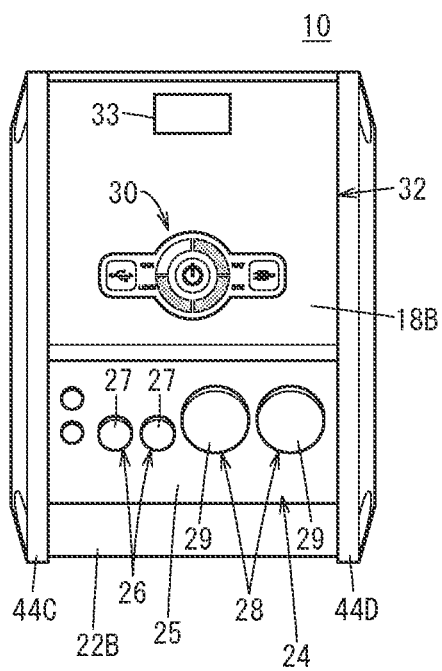
FIGS. 27A, 27B, 27C and 27D are top views of the charging power supply device according to an embodiment.
Figure 27B:
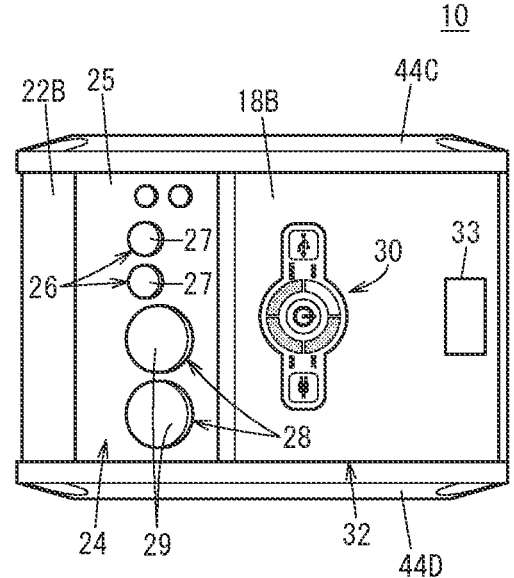
Figure 27C:
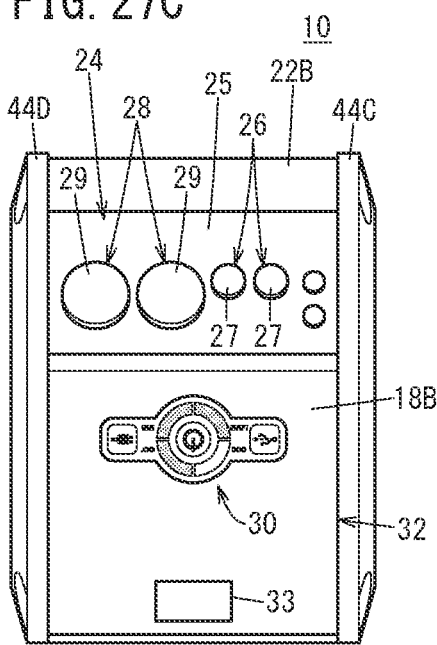
Figure 27D:
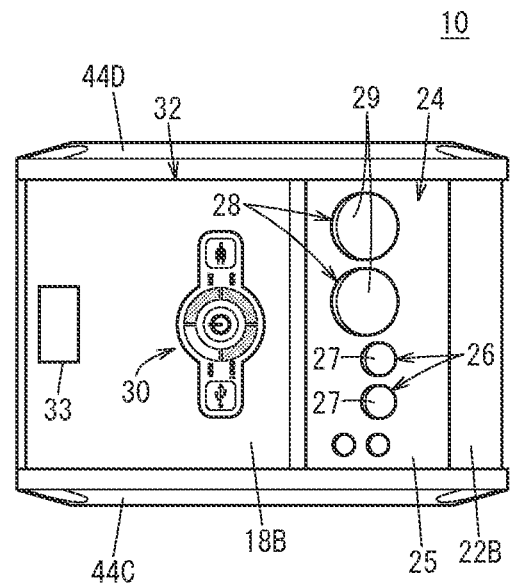

FIG. 23 shows the indicator. The indicator 30 includes a main switch light 100, a USB switch light 102, an AC switch light 104, a remaining amount indication light 106, a charge protection light 108, an overload light 110, a battery error light 112, and a system error light 114. The main switch light 100 is integrated with a main switch 116, the USB switch light 102 is integrated with a USB switch 118, and the AC switch light 104 is integrated with an AC switch 120. The USB switch light 102 corresponds to a fifth device according to the present invention, and the AC switch light 104 corresponds to a sixth device according to the present invention.

The main switch 116 is disposed so as to be sandwiched between the USB switch 118 and the AC switch 120. The main switch 116 is an operated element that is operated by the user to receive a start-up instruction of a system (a power converting apparatus 17, a blower 52, and the like shown in FIGS. 12A and 12B) of the charging power supply device 10. The main switch 116 displays an icon indicating that the main switch 116 serves as a main switch. The main switch light 100 is a display element notifying the user that the charging power supply device 10 is in a system operation state, a system stop state, and the like. The main switch 116 corresponds to a third device according to the present invention.

The USB switch 118 is an operated element that is operated by the user to receive an output instruction of DC power from the USB power output terminal 26. The USB switch 118 displays an icon indicating USB. The USB switch light 102 is a display element making a notification that the charging power supply device 10 is in a state that power can be output from the USB power output terminal 26, that power cannot be output therefrom, and the like. The USB switch 118 corresponds to a first device according to the present invention.

The AC switch 120 is an operated element, which is operated by the user to receive an output instruction of power from the AC power output terminal 28. The AC switch 120 displays an icon indicating a commercial power supply plug that is inserted into the AC power output terminal 28. The AC switch light 104 is a display element notifying the user that the charging power supply device 10 is in a state that power can be output from the AC power output terminal 28, that power cannot be output therefrom, and the like. The AC switch 120 corresponds to a second device according to the present invention.

The remaining amount indication light 106 is a display element notifying the user of the State Of Charge (SOC) and the like of the battery 16. The remaining amount indication light 106 is configured by four arcuate remaining amount indication lights 106a to 106d that are arranged around the circumference of the main switch 116.

The charge protection light 108 is a display element notifying the user that the charging power supply device 10 is in a state in which the battery 16 cannot be charged and the like. The charge protection light 108 is disposed between the remaining amount indication light 106 and the USB switch light 102.

The overload light 110 is a display element notifying the user that the charging power supply device 10 is in a state in which the battery 16 is overloaded and the like. The overload light 110 is disposed between the remaining amount indication light 106 and the USB switch light 102.

The battery error light 112 is a display element notifying the user that the charging power supply device 10 is in a state of an error and the like in the battery 16. The battery error light 112 is disposed between the remaining amount indication light 106 and the AC switch light 104.

The system error light 114 is a display element notifying the user that the charging power supply device 10 is in a state of a system error and the like. The system error light 114 is disposed between the remaining amount indication light 106 and the AC switch light 104.

FIG. 24 is a perspective view of the charging power supply device according to the present embodiment. FIG. 24 shows a part of the cover portion 32 and the recessed portion 24. As shown in FIG. 24, the USB power output terminals 26 and the AC power output terminals 28 are arranged side by side in the X direction. The USB power output terminals 26 are disposed near the positive side in the X direction, and the AC power output terminals 28 are disposed near the negative side in the X direction. The main switch 116, the USB switch 118, and the AC switch 120 are arranged side by side in the X direction. The USB switch 118 is disposed on the positive side in the X direction relative to the main switch 116, and the AC switch 120 is disposed on the negative side in the X direction relative to the main switch 116. That is, the USB switch 118 and the AC switch 120 are arranged in a direction in which the USB power output terminals 26 and the AC power output terminals 28 are arranged side by side, so that the order of arrangement thereof is identical to that of the USB power output terminals 26 and the AC power output terminals 28.

Thus, the USB power output terminals 26 and the USB switch 118 are arranged in a zone near the positive side in the X direction, and AC power output terminals 28 and the AC switch 120 are arranged in a zone near the negative side in the X direction. By zoning in this way, the user can easily recognize that the USB switch 118 positioned on the same side as the USB power output terminals 26 is a switch related to the USB power output terminals 26, and that the AC switch 120 positioned on the same side as the AC power output terminals 28 is a switch related to the AC power output terminals 28. In addition, the user can easily recognize that a switch positioned between the USB switch 118 and the AC switch 120 is the main switch 116.

The USB switch light 102 is integrated with the USB switch 118, and the AC switch light 104 is integrated with the AC switch 120. Thus, the USB switch light 102 and the AC switch light 104 are also arranged in the direction in which the USB power output terminal 26 and the AC power output terminal 28 are arranged, and the order of arrangement thereof is identical to that of the USB power output terminals 26 and the AC power output terminals 28.

The USB switch 118 and the AC switch 120 are provided in the cover portion 32, and the USB power output terminal 26 and the AC power output terminal 28 are provided in a member 25 forming a bottom part of the recessed portion 24. The surface of the cover portion 32 when closed is identical to the top surface 18B. The member 25 is formed continuously from the top surface 18B and is relative to the top surface 18B. Stated otherwise, the member 25 is disposed such that the normal direction of the top surface 18B in which the USB switch 118 and the AC switch 120 are arranged is different from the normal direction of a surface of the member 25 in which the USB power output terminal 26 and the AC power output terminal 28 are arranged.

Thus, the user can visually recognize simultaneously the USB switch 118, the AC switch 120, the USB power output terminal 26, and the AC power output terminal 28. Therefore, the user can operate the USB switch 118 and the AC switch 120 while confirming connection conditions of cables connected to the USB power output terminal 26 and the AC power output terminal 28.

In addition, the USB power output terminals 26 and the AC power output terminals 28 are arranged at the member 25 constituting the bottom part of the recessed portion 24. Thus, the USB power output terminals 26 and the AC power output terminals 28 protruding from the member 25 can be provided without protruding from the top surface 18B.

Further, a connector portion of a USB cable does not protrude from the top surface 18B in a state where the USB cable is connected to the USB power output terminal 26. Similarly, in a state where a commercial power supply plug is connected to the AC power output terminal 28, the commercial power supply plug does not protrude from the top surface 18B.

Further, the cover portion 32 in a closed state forms an outer shape of the casing 12. Unlike the USB power output terminal 26 and the AC power output terminal 28, other members do not connected to the USB switch 118 or the AC switch 120 disposed at the cover portion 32. Therefore, even when the USB switch 118 and the AC switch 120 are disposed at the cover portion 32, the cover portion 32 can maintain a flat surface. Further, the user can easily operate the USB switch 118 and the AC switch 120.

The USB switch 118 and the AC switch 120 are disposed on the positive side in the Y direction with respect to the pivoting shaft 31, and the USB power output terminals 26 and the AC power output terminals 28 are disposed on the negative side in the Y direction with respect to the pivoting shaft 31. That is, the USB switch 118 and the AC switch 120 on the one hand, and the USB power output terminals 26 and the AC power output terminals 28 on the other hand, are arranged so as to be distributed on each side of the pivoting shaft 31. Further, the USB switch 118 and the AC switch 120 as well as the USB power output terminals 26 and the AC power output terminals 28 are disposed near the pivoting shaft 31. Accordingly, when the cover portion 32 is pivoted in the opening direction, the user can visually recognize the USB switch 118 and the AC switch 120 from the side of the USB power output terminals 26 and the AC power output terminals 28.

The indicator 30 notifies the user of the state of the charging power supply device 10 by a combination of a light emission color and a lighting pattern. As shown in FIG. 23, the remaining amount indication light 106 is disposed at a central portion of the indicator 30. The remaining amount indication light 106 has a larger display area than the other lights, that is, the main switch light 100, the USB switch light 102, the AC switch light 104, the charge protection light 108, the overload light 110, the battery error light 112, and the system error light 114. Therefore, the user can easily visually recognize the display of the remaining amount indication light 106 even from a position far from the charging power supply device 10. In the present embodiment, the remaining amount indication light 106 is provided with a function of notifying a user of the overview of the state of the charging power supply device 10. Since the display areas of the charge protection light 108, the overload light 110, the battery error light 112, and the system error light 114 are relatively small, the area occupied by the indicator 30 can be reduced. In the present embodiment, the charge protection light 108, the overload light 110, the battery error light 112, and the system error light 114 are provided with a function of notifying the user of more detailed contents, with respect to the overview of the state of the charging power supply device 10 notified by the remaining amount indication light 106.

FIG. 25 is a table showing states of the charging power supply device based on a combination of light emission colors and lighting patterns of the indicator. The indicator 30 can emit five colors of "White", "Blue", "Green", "Yellow", and "Red". The indicator 30 can emit light in three kinds of lighting patterns of being turned "On", "Blinking", and being turned "Off". Hereinafter, a description will be given of a state of the charging power supply device 10 notified to the user, according to the light emission color and the lighting pattern of the indicator 30.

When the emission color of the main switch light 100 is "White" and the lighting pattern is "On", this indicates that the state of the charging power supply device 10 is in system operation (power is on). When the light emission color of the main switch light 100 is "White" and the lighting pattern is "Blinking", this indicates that the charging power supply device 10 is in a state of preparing for system operation or preparing for a system stop. When the lighting pattern of the main switch light 100 is "Off", this indicates that the charging power supply device 10 is in a state of a system stop (power is off).

When the light emission color of the USB switch light 102 is "White" and the lighting pattern is "On", this indicates that the charging power supply device 10 is in a state that power can be output from the USB power output terminals 26 (power is on). When the light emission color of the USB switch light 102 is "White" and the lighting pattern is "Blinking", this indicates that the charging power supply device 10 is in a state of preparing for power output from the USB power output terminals 26. When the lighting pattern of the USB switch light 102 is "Off", this indicates that the charging power supply device 10 is in a state in which power cannot be output from the USB power output terminals 26 (power is off).

When the emission color of the AC switch light 104 is "White" and the lighting pattern is "On", this indicates that the state of the charging power supply device 10 is a state in which power can be output from the AC power output terminals 28 (power is on). When the light emission color of the AC switch light 104 is "White" and the lighting pattern is "Blinking", this indicates that the charging power supply device 10 is in a state of preparing for power output from the AC power output terminals 28. When the lighting pattern of the AC switch light 104 is "Off", this indicates that the charging power supply device 10 is in a state in which power cannot be output from the AC power output terminals 28 (power is off).

When the emission color of the USB switch light 102 is "Blue" and the lighting pattern is "On", this indicates that the charging power supply device 10 is in a state of discharging from the USB power output terminal(s) 26. When the lighting pattern of the USB switch light 102 is "Off", this indicates that the charging power supply device 10 is in a state of not discharging from the USB power output terminals 26.

When the emission color of the AC switch light 104 is "Blue" and the lighting pattern is "On", this indicates that the charging power supply device 10 is in a state of discharging from the AC power output terminal(s) 28. When the light emission color of the AC switch light 104 is "Blue" and the lighting pattern is "Off", this indicates that the charging power supply device 10 is in a state of not discharging from the AC power output terminals 28.

When the emission color of the remaining amount indication light 106 is "Blue" and the lighting pattern is "On", this indicates that the charging power supply device 10 is in a state of discharging. When the light emission color of the remaining amount indication light 106 is "Blue" and the lighting pattern is "Blinking", this indicates that the charging power supply device 10 is in a state of counting down to an overload stop. When the lighting pattern of the remaining amount indication light 106 is "Off", this indicates that the charging power supply device 10 is in a state of not discharging.

When the light emission color of the remaining amount indication light 106 is "Green" and the lighting pattern is "On", this indicates that the charging power supply device 10 is in a state of charging the battery 16. When the light emission color of the remaining amount indication light 106 is "Green" and the lighting pattern is "Blinking", this indicates that the charging power supply device 10 is in a standby state for starting charging of the battery 16. When the lighting pattern of the remaining amount indication light 106 is "Off", this indicates that the charging power supply device 10 is in a state of not charging the battery 16.

When the light emission color of the remaining amount indication light 106 is "Yellow" and the lighting pattern is "Blinking", this indicates that the charging power supply device 10 is in a state of counting down to an overload stop.

When the light emission color of the overload light 110 is "Yellow" and the lighting pattern is "On", this indicates that the charging power supply device 10 is in a state of an overload. When the lighting pattern of the overload light 110 is "Off", it indicates that the charging power supply device 10 is not in a state of an overload.

When the light emission color of the remaining amount indication light 106 is "Red" and the lighting pattern is "Blinking", this indicates that the charging power supply device 10 is in a state of transitioning to an error stop.

When the light emission color of the charge protection light 108 is "Red" and the lighting pattern is "On", this indicates that the charging power supply device 10 is in a state in which the battery 16 cannot be charged. When the lighting pattern of the charge protection light 108 is "Off", this indicates that the charging power supply device 10 is in a state in which the battery 16 can be charged.

When the light emission color of the battery error light 112 is "Red" and the lighting pattern is "On", this indicates that the charging power supply device 10 is in a state of an error of the battery 16. When the lighting pattern of the charge protection light 108 is "Off", this indicates that the charging power supply device 10 is not in a state of an error of the battery 16.

When the light emission color of the system error light 114 is "Red" and the lighting pattern is "On", this indicates that the charging power supply device 10 is in a state of a system error. When the lighting pattern of the charge protection light 108 is "Off", this indicates that the charging power supply device 10 is not in a state of a system error.

FIGS. 26A to 26E show display examples of the remaining amount indication light based on the SOC of the battery. The remaining amount indication lights 106a to 106d indicate the SOC level of the battery by being turned "On", "Blinking", and being turned "Off". In FIGS. 26A to 26E, frames presenting the remaining amount indication lights 106a to 106d with dots therein indicate an "On" state, and those without dots indicate an "Off" state. The SOC values of the battery 16 are classified as "Level 0", "Level 1", "Level 2", "Level 3", "Level 4", "Level 5", "Level 6", "Level 7", and "Level 8" in ascending order. FIG. 26A shows a display example of the remaining amount indication lights 106a to 106d when the SOC of the battery 16 is "Level 0". FIG. 26B shows a display example of the remaining amount indication lights 106a to 106d when the SOC of the battery 16 is "Level 2". FIG. 26C shows a display example of the remaining amount indication lights 106a to 106d when the SOC of the battery 16 is "Level 4". FIG. 26D shows a display example of the remaining amount indication lights 106a to 106d when the SOC of the battery 16 is "Level 6". FIG. 26E shows a display example of the remaining amount indication lights 106a to 106d when the SOC of the battery 16 is "Level 8".

When the SOC of the battery 16 is "Level 0", the remaining amount indication lights 106a to 106d are turned "Off" as shown in FIG. 26A. When the SOC of the battery 16 is "Level 1", the remaining amount indication light 106a "blinks" and the remaining amount indication lights 106b to 106d are turned "Off". When the SOC of the battery 16 is "Level 2", the remaining amount indication light 106a is turned "On" and the remaining amount indication lights 106b to 106d are turned "Off" as shown in FIG. 26B. When the SOC of the battery 16 is "Level 3", the remaining amount indication light 106a is turned "On", the remaining amount indication light 106b "blinks", and the remaining amount indication lights 106c to 106d are turned "Off".

When the SOC of the battery 16 is "Level 4", the remaining amount indication lights 106a to 106b are turned "On" and the remaining amount indication lights 106c to 106d are turned "Off" as shown in FIG. 26C. When the SOC of the battery 16 is "Level 5", the remaining amount indication lights 106a to 106b are turned "On", the remaining amount indication light 106c "blinks", and the remaining amount indication light 106d is turned "Off". When the SOC of the battery 16 is "Level 6", the remaining amount indication lights 106a to 106c are turned "On" and the remaining amount indication light 106d is turned "Off" as shown in FIG. 26D. When the SOC of the battery 16 is "Level 7", the remaining amount indication lights 106a to 106c are turned "On" and the remaining amount indication light 106d "blinks". When the SOC of the battery 16 is "Level 8", the remaining amount indication lights 106a to 106d are turned "On" as shown in FIG. 26E.

The remaining amount indication light 106 is configured by four arcuate remaining amount indication lights 106a to 106d that are arranged around the circumference of the main switch 116. Therefore, even when the user looks at the remaining amount indication light 106 from a distance or from any angle, the user can recognize the remaining amount (SOC) of the battery 16 at a glance.

FIGS. 27A to 27D are top views of the charging power supply device according to the present embodiment. FIGS. 27A to 27D show that the charging power supply device 10 is rotated clockwise from FIG. 27A to 27D. The main switch 116, the USB switch 118, and the AC switch 120 display icons indicating their respective functions. Thus, regardless of a direction in which the charging power supply device 10 is installed, the user can recognize the function of each switch.

The above describes a preferred embodiment of the present invention, but the present invention is not limited to the above-described embodiment, and various modifications could be adopted therein without departing from the essence and gist of the present invention.

[Modification 1]

For example, in the above embodiment, an example is described of a case in which the ventilation paths 36A, 36C, 36D, and 36F are intake paths and the ventilation path 36E is an exhaust path, but the present invention is not limited to this. For example, the ventilation paths 36A, 36C, 36D, and 36F may be exhaust paths and the ventilation path 36E may be an intake path.

[Modification 2]

In the above-described embodiment, an example is described of a case in which the battery 16 is inserted into and removed from the containment chamber 14. The battery 16 may be non-removable from or non-insertable into the chamber 14.

[Modification 3]

Further, in the above-described embodiment, the USB switch 118 is an operated element that receives an output instruction by the user, for outputting DC power from the USB power output terminal 26, and the AC switch 120 is an operated element that receives an output instruction by the user, for outputting AC power from the AC power output terminal 28. On the other hand, the AC switch 120 may be used as an operated element 120 which receives an input instruction by the user for inputting AC power to the AC power input terminal 34A, and the USB switch 118 may be used as an operated element 118 which receives an input instruction by the user for inputting DC power to the DC power input terminal 34B. In this case, it is desirable to reverse the arrangement of the AC power input terminal 34A and the DC power input terminal 34B in the above embodiment.

Figure 28:
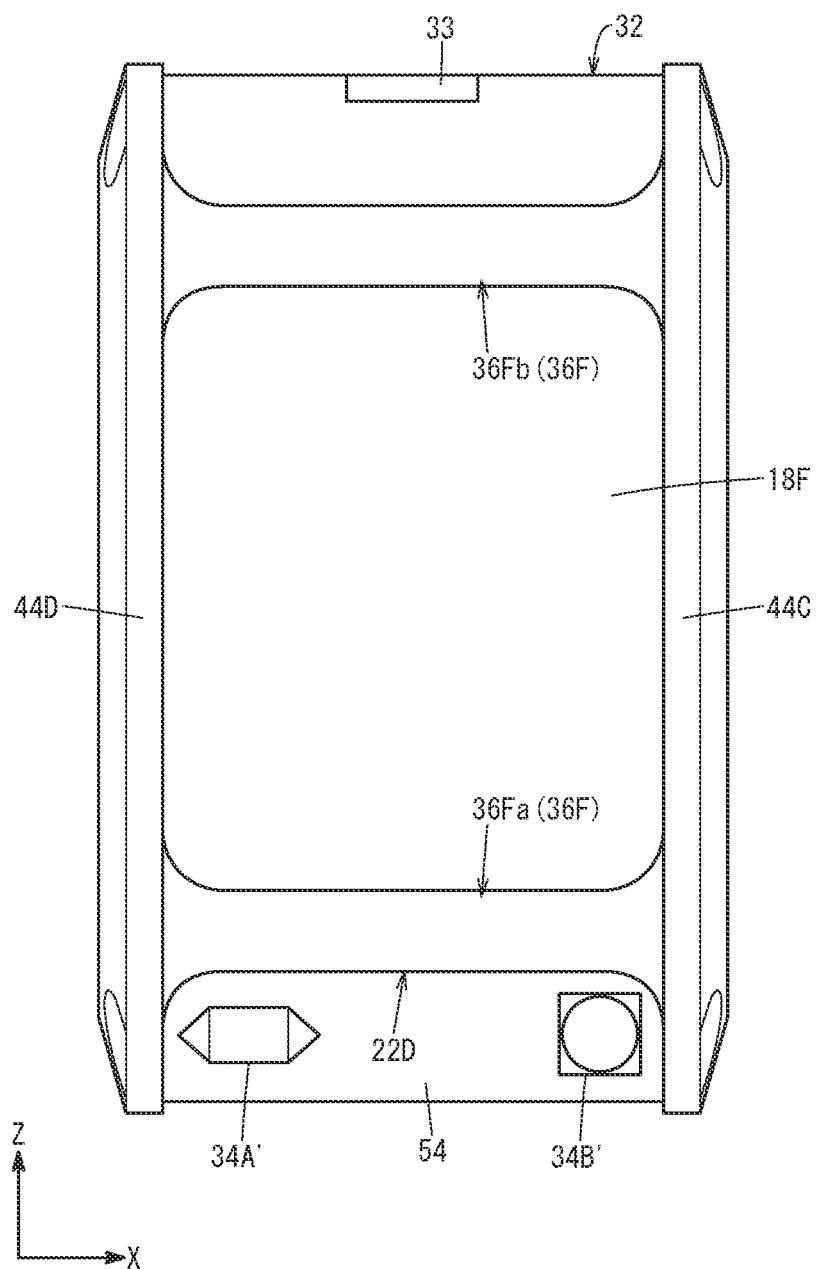
FIG. 28 is a rear view of the charging power supply device according to an embodiment.

FIG. 28 is a rear view of the charging power supply device. As shown in FIG. 28, an AC power input terminal 34A' and a DC power input terminal 34B' are arranged side by side in the X direction, while the DC power input terminal 34B' is disposed near the positive side in the X direction, and the AC power input terminal 34A' is disposed near the negative side in the X direction. Thus, the DC power input terminal 34B' and the operated element 118 are arranged in a zone near the positive side in the X direction, and the AC power input terminal 34A' and the operated element 120 are arranged in a zone near the negative side in the X direction. By zoning in this way, the user can easily recognize that the operated element 118 positioned on the same side as the DC power input terminal 34B' is a switch related to the DC power input terminal 34B', and that the operated element 120 positioned on the same side as the AC power input terminal 34A' is a switch related to the AC power input terminal 34A'. Further, the user can easily recognize that a switch disposed between the operated element 118 and the operated element 120 is the main switch 116. The AC power input terminal 34A' corresponds to a fourth terminal of the present invention, and the DC power input terminal 34B' corresponds to a third terminal of the present invention.

[Modification 4]

The charging power supply device 10 may include a control unit (not shown). When receiving an output instruction from a user via the USB switch 118 or the AC switch 120 before receiving a start-up instruction from the user via the main switch 116, the control unit prohibits generation of output power from the USB power output terminal 26 or the AC power output terminal 28.

In addition, the charging power supply device 10 need not necessarily include the battery 16 inside the casing 12, but the battery 16 may be provided outside the casing 12 and connected to the charging power supply device 10 by a cable or the like.

The following is a summary of the embodiments described above.

The charging power supply device (10) includes a power supply in the casing (12), and the casing includes the first terminal (26) to which a load is to be connected, the load receiving an output power of a first type, the second terminal (28) to which a load is to be connected, the load receiving an output power of a second type, the first device (118) configured to receive from a user an output instruction of power from the first terminal, and the second device (120) configured to receive from a user an output instruction of power from the second terminal, wherein the first device and the second device are arranged in a direction in which the first terminal and the second terminal are arranged, in a manner that the order of arrangement of the first device and the second device is identical to the order of arrangement of the first terminal and the second terminal. With this configuration, the user easily recognizes that the first device positioned on the same side as the first terminal is a device that receives the output instruction to output power from the first terminal, and that the second device positioned on the same side as the second terminal is a device that receives the output instruction to output power from the second terminal.

The charging power supply device may include the third device (116) configured to receive from a user a start-up instruction of the charging power supply device, wherein the third device may be disposed so as to be sandwiched between the first device and the second device, the first device is disposed on one side relative to the third device and the second device is disposed on the other side relative to the third device, in the direction in which the first terminal and the second terminal are arranged, the first terminal may be disposed closer to the one side and the second terminal may be disposed closer to the other side. With this configuration, the user easily recognizes that the third device positioned between the first device and the second device is a device that receives the start-up instruction for the charging power supply device.

The charging power supply device may include the fourth device (106) configured to notify a user of a state of the power supply, wherein the fourth device may be disposed so as to be sandwiched between the first device and the second device, the first device is disposed on one side relative to the fourth device and the second device is disposed on the other side relative to the fourth device, in the direction in which the first terminal and the second terminal are arranged, the first terminal may be disposed closer to the one side and the second terminal may be disposed closer to the other side. With this configuration, the user easily recognizes that the fourth device positioned between the first device and the second device is a device that makes a notification of the state of the power supply.

REFERENCE SIGNS LIST

10: charging power supply device
12: casing
26: USB power output terminal
28: AC power output terminal
106, 106a to 106d: remaining amount indication light
116: main switch
118: USB switch
120: AC switch

What is claim is:

1. A power output device including an internal power supply in a casing, the internal power supply configured to output electric power to outside, the power output device comprising:
a first terminal to which a load is to be connected, the load receiving DC power from the power output device;
a second terminal to which a load is to be connected, the load receiving AC power from the power output device;
a first device configured to receive from a user an output instruction of power from the first terminal;
a second device configured to receive from a user an output instruction of power from the second terminal;
a first cap configured to cover the first terminal; and a second cap configured to cover the second terminal,
wherein the first terminal and the second terminal are arranged in a direction that is identical to a direction in which the first device and the second device are arranged, in a manner that order of arrangement of the first terminal and the second terminal is identical to order of arrangement of the first device and the second device, and
the first terminal and the second terminal are installed in one recessed portion that is formed by an indentation with respect to a surface of the casing on which the first device and the second device are provided.

2. The power output device according to claim 1, comprising a third device configured to receive from a user a start-up instruction of the power output device,
wherein the third device is disposed at a position that is sandwiched between the first device and the second device,
the first device is disposed on one side relative to the third device and the second device is disposed on another side relative to the third device,
in the direction in which the first device and the second device are arranged, the first terminal is disposed closer to the one side and the second terminal is disposed closer to the another side.

3. The power output device according to claim 1, comprising a fourth device configured to notify a user of a state of the internal power supply,
wherein the fourth device is disposed at a position that is sandwiched between the first device and the second device,
the first device is disposed on one side relative to the fourth device and the second device is disposed on another side relative to the fourth device,
in the direction in which the first device and the second device are arranged, the first terminal is disposed closer to the one side and the second terminal is disposed closer to the another side.

4. The power output device according to claim 1, wherein a surface at which the first terminal and the second terminal are disposed and a surface at which the first device and the second device are disposed face in an identical direction.

5. The power output device according to claim 4, wherein the first terminal and the second terminal, and the first device and the second device are arranged in a manner that a normal direction of a surface at which the first terminal and the second terminal are disposed, is different from a normal direction of a surface at which the first device and the second device are disposed.

6. The power output device according to claim 5, wherein the surface at which the first device and the second device are disposed is arranged to form an outer shape of the casing.

7. The power output device according to claim 1, comprising:
an internal load to which power is input from outside;
a third terminal configured to receive the DC power from outside; and
a fourth terminal configured to receive the AC power from outside,
wherein the third terminal and the fourth terminal are arranged in the direction in which the first device and the second device are arranged, in a manner that order of arrangement of the third terminal and the fourth terminal is identical to the order of arrangement of the first device and the second device.

8. The power output device according to claim 1, comprising:
an opening configured to provide communication between inside and outside of the casing; and
a cover portion provided to the casing pivotably on a pivoting shaft to cover the opening,
wherein the first device and the second device are arranged at the cover portion.

9. The power output device according to claim 8, wherein the first terminal and the second terminal are arranged at the casing,
the first device and the second device are arranged on one side relative to the pivoting shaft, and the first terminal and the second terminal are arranged on another side relative to the pivoting shaft.

10. The power output device according to claim 9, wherein the first device and the second device, and the first terminal and the second terminal are arranged near the pivoting shaft.

11. The power output device according to claim 8, wherein the cover portion includes a release portion configured to release covering of the opening with the cover portion or release engagement between the cover portion and the casing.

12. The power output device according to claim 1, wherein the first device and the second device are different from each other at least in external appearance or a shape.

13. The power output device according to claim 3, further comprising a third device configured to receive from a user a start-up instruction of the power output device,
wherein
the third device is disposed at a position that is sandwiched between the first device and the second device, and
the fourth device is disposed at least at one of a position that is sandwiched between the first device and the third device, or a position that is sandwiched between the second device and the third device.

14. The power output device according to claim 3, wherein size of the fourth device is formed to be larger than size of the first device or the second device.

15. The power output device according to claim 2, further comprising a control unit,
wherein when receiving the output instruction from the first device or the second device before receiving the start-up instruction from a user via the third device, the control unit is configured to prohibit generation of the output power from the first terminal or the second terminal.

16. The power output device according to claim 1, further comprising a fifth device configured to notify a user that a state of the power output device is in a state that the DC power can be output from the first terminal, or that the DC power cannot be output therefrom,
wherein the first device and the fifth device are formed integrally with each other.

17. The power output device according to claim 1, comprising a sixth device configured to notify a user that a state of the power output device is in a state that the AC power can be output from the second terminal, or that the AC power cannot be output therefrom,
wherein the second device and the sixth device are formed integrally with each other.

18. The power output device according to claim 1, wherein the first device displays an icon indicating USB.

19. The power output device according to claim 1, wherein the second device displays an icon indicating a commercial power supply plug.

20. The power output device according to claim 1, wherein the first device and the second device are different from each other, according to the DC power and the AC power, respectively, at least in external appearance or a shape.

21. A power input device including a casing, an internal load to which electric power is input from outside, the power input device comprising:
- a third terminal configured to receive DC power from outside;
- a fourth terminal configured to receive AC power from outside;
- a first device configured to receive from a user an input instruction of power from the third terminal; and
- a second device configured to receive from a user an input instruction of power from the fourth terminal,
- wherein the third terminal and the fourth terminal are arranged in a direction that is identical to a direction in which the first device and the second device are arranged, in a manner that order of arrangement of the third terminal and the fourth terminal is identical to order of arrangement of the first device and the second device, and
- the third terminal and the fourth terminal are installed in one recessed portion that is formed on the casing.

22. A power output/input device including in a casing, at least one of an internal power supply or an internal load, the internal power supply configured to output electric power to outside, electric power being input from outside to the internal load, the power output/input device comprising:
- at least one of
  - a set including a first terminal, a second terminal, a first cap, and a second cap, or
  - another set including a third terminal and a fourth terminal,
- wherein a load is to be connected to the first terminal, the load receives DC power from the power output/input device, a load is to be connected to the second terminal, the load receives AC power from the power output/input device, the first cap covers the first terminal, the second cap covers the second terminal, the third terminal is configured to receive the DC power from outside, and the fourth terminal is configured to receive the AC power from outside;
- a first device configured to receive from a user an output instruction of power from the first terminal or an input instruction of power from the third terminal;
- a second device configured to receive from a user an output instruction of power from the second terminal or an input instruction of power from the fourth terminal;
- an opening configured to provide communication between inside and outside of the casing; and
- a cover portion provided to the casing pivotably on a pivoting shaft to cover the opening,
- wherein the first device and the second device are arranged at the cover portion,
  - the set including the first terminal and the second terminal is installed in one recessed portion that is formed by an indentation with respect to a surface of the casing on which the first device and the second device are provided, and
  - the another set including the third terminal and the fourth terminal is installed in another recessed portion that is formed on the casing.

23. A power output device including an internal power supply in a casing, the internal power supply configured to output electric power to outside, the power output device comprising:
- a first terminal to which a load is to be connected, the load receiving an output power of a first type from the power output device;
- a second terminal to which a load is to be connected, the load receiving an output power of a second type that is different from the first type, from the power output device;
- a first device configured to receive from a user an output instruction of the output power of the first type from the first terminal;
- a second device configured to receive from a user an output instruction of the output power of the second type from the second terminal; and
- a third device that is a main switch configured to receive from a user a start-up instruction of the power output device,
- wherein the first device, the second device, and the third device are arranged in one direction on a same plane, and
- the first terminal and the second terminal are arranged in a direction that is identical to a direction in which the first device, the second device, and the third device are arranged, in a manner that order of arrangement of the first terminal and the second terminal is identical to order of arrangement of the first device and the second device.

* * * * *